(12) United States Patent
Yamaguchi et al.

(10) Patent No.: US 9,824,938 B2
(45) Date of Patent: Nov. 21, 2017

(54) CHARGED PARTICLE BEAM DEVICE AND INSPECTION DEVICE

(71) Applicant: Hitachi High-Technologies Corporation, Tokyo (JP)

(72) Inventors: Atsuko Yamaguchi, Tokyo (JP); Osamu Inoue, Tokyo (JP); Hiroki Kawada, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/303,813

(22) PCT Filed: Mar. 31, 2015

(86) PCT No.: PCT/JP2015/060205
§ 371 (c)(1),
(2) Date: Oct. 13, 2016

(87) PCT Pub. No.: WO2015/159705
PCT Pub. Date: Oct. 22, 2015

(65) Prior Publication Data
US 2017/0040230 A1    Feb. 9, 2017

(30) Foreign Application Priority Data

Apr. 14, 2014   (JP) ................................. 2014-082640

(51) Int. Cl.
*H01J 37/28* (2006.01)
*H01L 21/66* (2006.01)
(Continued)

(52) U.S. Cl.
CPC ............ *H01L 22/12* (2013.01); *H01J 37/244* (2013.01); *H01J 37/285* (2013.01);
(Continued)

(58) Field of Classification Search
CPC ..... H01L 22/00; H01L 22/12; H01L 22/0332; H01L 22/0335; H01L 22/0337; H01L 22/0338; H01J 37/244; H01J 37/285
See application file for complete search history.

(56) References Cited

U.S. PATENT DOCUMENTS

| | | | |
|---|---|---|---|
| 2012/0032077 A1 | 2/2012 | Matsumoto | |
| 2012/0076393 A1* | 3/2012 | Ivanchenko | G03F 7/70466 382/145 |
| 2012/0267528 A1* | 10/2012 | Sakai | G03F 7/70466 250/307 |

FOREIGN PATENT DOCUMENTS

| | | |
|---|---|---|
| JP | 2012-519391 A | 8/2012 |
| KR | 10-2012-14547 A | 2/2012 |

OTHER PUBLICATIONS

International Search Report of PCT/JP2015/060205 dated Jun. 23, 2015.
(Continued)

*Primary Examiner* — David E Smith
(74) *Attorney, Agent, or Firm* — Mattingly & Malur, PC

(57) ABSTRACT

Provided is a charged particle beam device which can specify a position of an initial core with high accuracy even when fine line and space patterns are formed by an SADP in plural times. The charged particle beam device includes a detector (810) which detects secondary charged particles discharged from a sample (807) when a charged particle beam is emitted to the sample having a plurality of patterns of line shape, a display unit (817) which displays image data of a surface of the sample on the basis of a signal of the secondary charged particles, a calculation unit (812) which calculates an LER value with respect to the plurality of the patterns of line shape from the image data, and a determination unit (816) which compares the values to determine a position of the initial core.

15 Claims, 13 Drawing Sheets

(51) Int. Cl.
*H01J 37/244* (2006.01)
*H01J 37/285* (2006.01)
*H01L 21/033* (2006.01)

(52) U.S. Cl.
CPC ...... *H01L 21/0332* (2013.01); *H01L 21/0335* (2013.01); *H01L 21/0337* (2013.01); *H01L 21/0338* (2013.01); *H01L 22/00* (2013.01)

(56) References Cited

OTHER PUBLICATIONS

Korean Office Action received in corresponding Korean Application No. 10-2016-7027412 dated Aug. 10, 2017.

* cited by examiner

FIG. 4
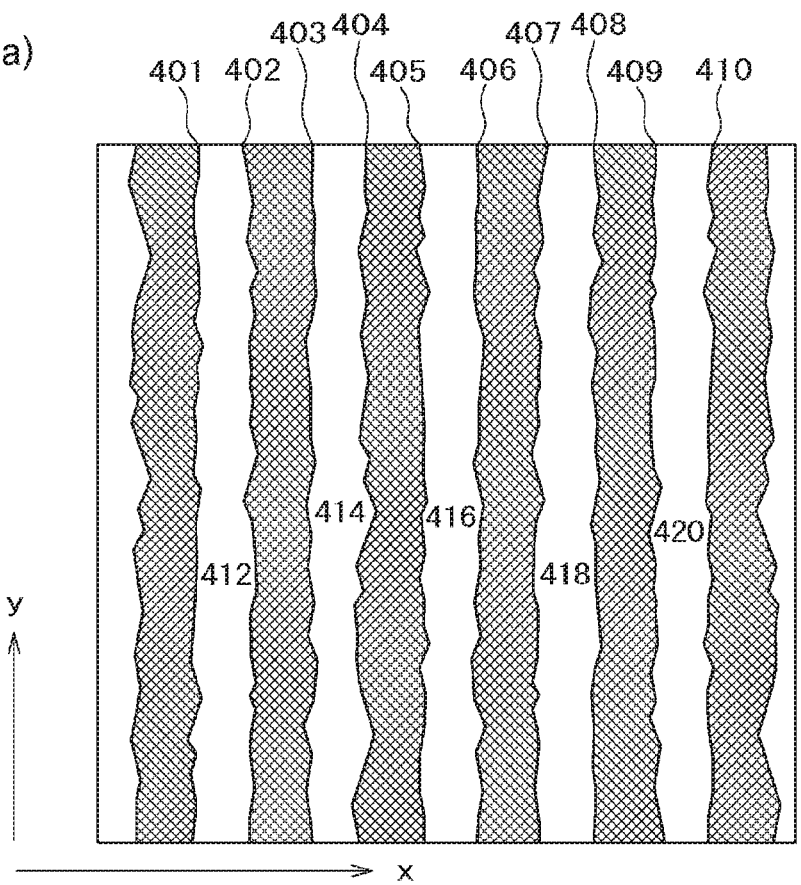
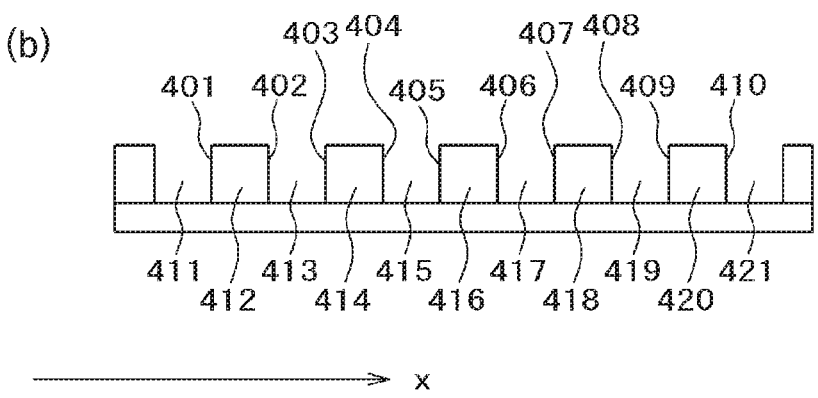

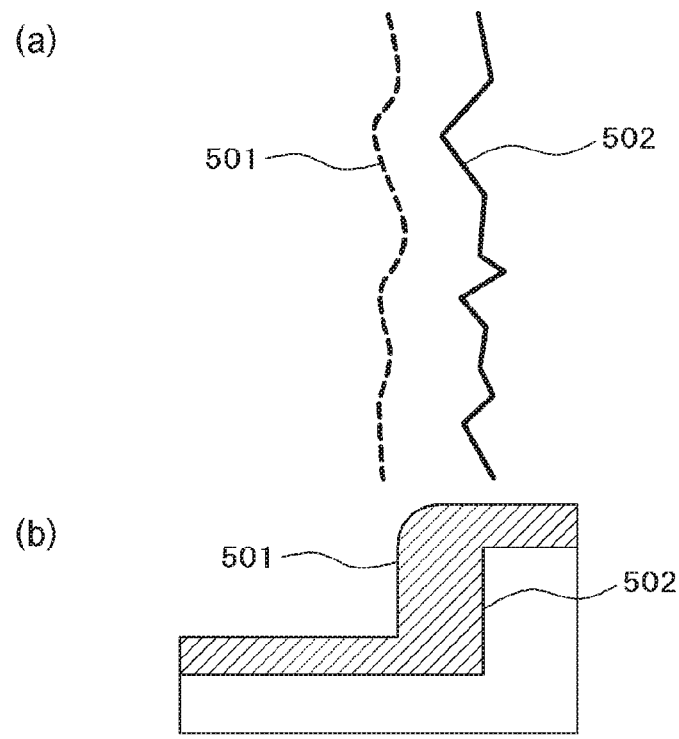
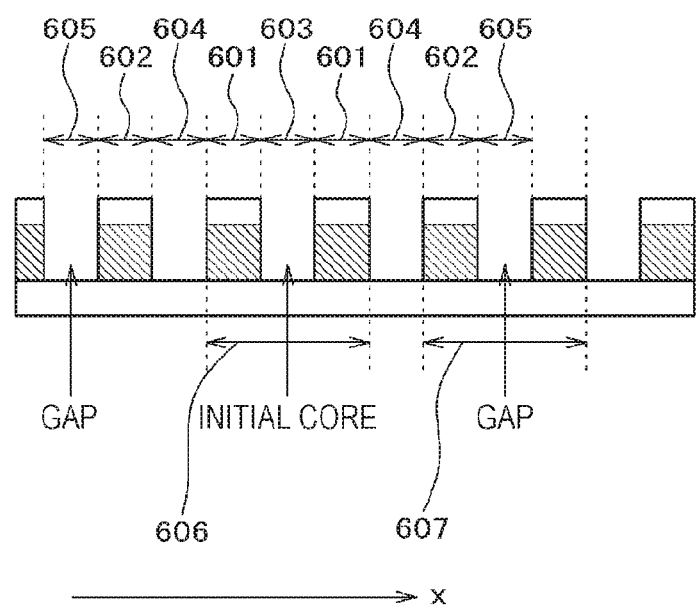

FIG. 11
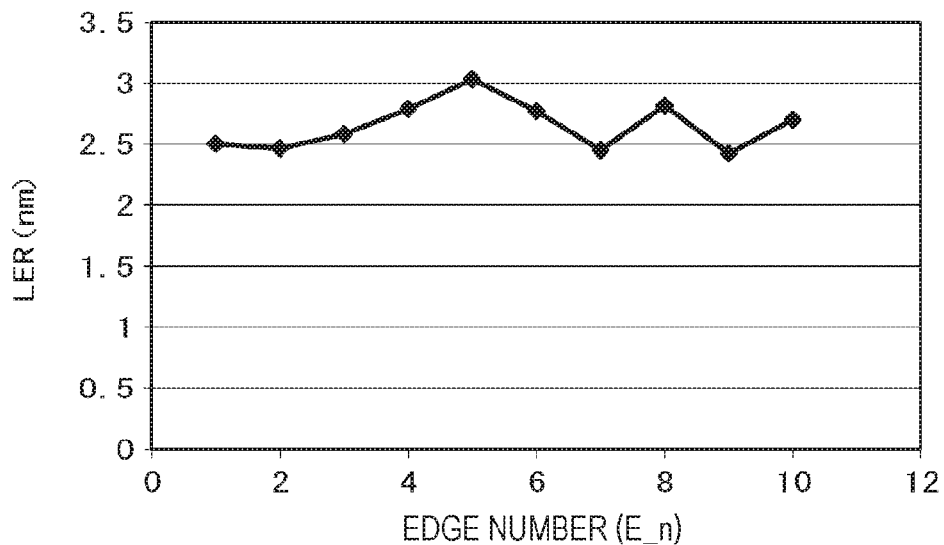
FIG. 12
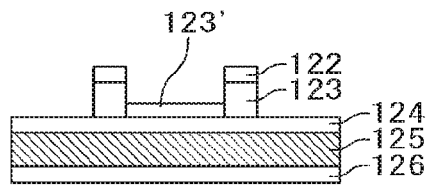
FIG. 13
| Average results | | |
|---|---|---|
| items | CD (nm) | number of data |
| Linewidth | | |
| CDL_final | 18.24 | 5 |
| CDL_finalcore | 16.38 | 2 |
| CDL_finalgap | 19.51 | 3 |
| Space Width | | |
| CDS_final | 17.73 | 4 |
| CDS_initcore | 20.03 | 1 |
| CDS_2ndcore | 17.94 | 2 |
| CDS_gap | 15.02 | 1 |
| Others | | |
| CD_core | 52.79 | 1 |
| CD_gap | 53.80 | 1 |

(a)

| Line # | Category | x coordinate (nm) | Local Overlay (nm) | Total Overlay (nm) |
|---|---|---|---|---|
| 1 | C | −126.59 | | |
| 2 | D | −90.54 | | |
| 3 | A | −54.33 | | |
| 4 | B | −17.68 | | |
| 5 | C | 18.02 | | |
| 6 | D | 55.45 | | |
| 7 | A | 93.22 | | |
| 8 | B | 128.51 | | |
| 9 | C | 165.30 | | |

(b)

1501  1502

| Line # | Category | x location (nm) | Local Overlay (nm) | Total Overlay (nm) |
|---|---|---|---|---|
| 1 | C | −126.59 | −0.59 | 1.51 |
| 2 | D | −90.54 | −0.54 | 1.56 |
| 3 | A | −54.33 | −0.33 | 1.77 |
| 4 | B | −17.68 | 0.32 | 2.42 |
| 5 | C | 18.02 | 0.02 | 2.12 |
| 6 | D | 55.45 | 1.45 | 3.55 |
| 7 | A | 93.22 | 3.22 | 5.32 |
| 8 | B | 128.51 | 2.51 | 4.61 |
| 9 | C | 165.30 | 3.30 | 5.40 |

FIG. 19

| EDGE NUMBER IN IMAGE | LER(nm) | NUMBER IN FIG. 18 |
|---|---|---|
| 1 | 3.44 | |
| 2 | 3.71 | 1807 |
| 3 | 3.66 | |
| 4 | 3.62 | 1803 |
| 5 | 3.44 | 1804 |
| 6 | 3.52 | |
| 7 | 3.55 | 1808 |
| 8 | 3.29 | |
| 9 | 3.64 | |
| 10 | 3.91 | 1805 |
| 11 | 4.01 | |
| 12 | 3.65 | 1801 |
| 13 | 3.81 | 1802 |
| 14 | 3.55 | |
| 15 | 4.12 | 1806 |
| 16 | 3.27 | |

CHARGED PARTICLE BEAM DEVICE AND INSPECTION DEVICE

TECHNICAL FIELD

The present invention relates to a charged particle beam device and an inspection device.

BACKGROUND ART

In a process of manufacturing a semiconductor device, a new technology is introduced in which a critical dimension (hereinafter, referred to as CD) of a pattern is equal to or less than 30 nm, and the pattern is formed at a smaller pitch. As a typical example, there is a process called a self-aligned double patterning (SADP). In this scheme, a film is formed over all after a resist pattern is formed by a conventional lithography, and subjected to etching to form a pattern in a side wall of the resist pattern. Therefore, it is possible to form a dense pattern of which the pitch corresponds to the half pitch of the pattern created by the lithography in the beginning. Furthermore, in recent years, there is developed a process called a self-aligned quadruple patterning (SAQP) in which film deposition is performed on the pattern formed by the SADP two times to divide the pitch by etching (that is, the SADP is performed twice). An example of such a scheme is illustrated in FIG. 1. FIG. 1 is a cross-sectional view schematically illustrating the pattern for describing a process of forming fine lines and spaces using the SAQP. FIGS. 1(a) to 1(f) illustrate a process of forming a line pattern by a first SADP, and FIGS. 1(g) to 1(i) illustrate a process of forming the line pattern by a second SADP. First, a resist layer 121 patterned in a line shape is formed on a silicon oxide film 126, a silicon nitride film 125, a silicon oxide film 124, a carbon film 123, and an antireflection film 122 which are sequentially stacked from the bottom side (FIG. 1(a)). Next, a silicon oxide film 131 is formed to cover the resist layer 121 (FIG. 1(b)). Further, while the resist layer 121 is illustrated by one in the drawing, a number of resist layers are formed in practice. Next, the silicon oxide film 131 is subjected to an anisotropic etching to form the silicon oxide film 131 of a line shape on both sides of the resist layer 121 (FIG. 1(c)). Next, the resist layer 121 is eliminated by ashing (FIG. 1(d)). Next, a stacked film of the antireflection film 122 and the carbon film 123 is subjected to the anisotropic etching using the silicon oxide film 131 of a line shape as a mask so as to form the stacked film of a line shape (FIG. 1(e)). Next, the antireflection film 122 is eliminated (FIG. 1(f)). Through this process, it is possible to form a dense pattern of which the pitch corresponds to the half pitch of the pattern formed by the lithography in the beginning.

Subsequently, the silicon oxide film 141 is subjected to an anisotropic dry etching after covering the carbon film 123 of a line shape to form a silicon oxide film 141, and thus the silicon oxide film 141 of a line shape is formed on both sides of the carbon film 123 (FIG. 1(g)). Next, the carbon film 123 is eliminated (FIG. 1(h)). Next, the anisotropic etching is performed using the silicon oxide film 141 as a mask to form a stacked film of the silicon oxide film 124 and the silicon nitride film 125 of a line shape (FIG. 1(i)). Therefore, it is possible to divide the pitch further more with respect to the pattern formed by the SADP. Further, the above materials are given as an example, and not limited thereto.

FIG. 1(i) shows a final pattern shape, but there is a possibility to inspect the pattern after the etching mask material left on the top of the line is further eliminated. Herein, the symbols 1, 2, and 3 indicate space portions in the final shape. In addition, the symbols 101 to 108 indicate the edges of interest in the line pattern.

In the SAQP, one line formed by the conventional lithography in the beginning becomes four lines in the end. Therefore, the nature (CD or roughness shape of the edge) of the line pattern and the space pattern arranged in parallel varies in a cycle of four lines and spaces.

Further, a space (mandrel: a space portion indicated by symbol 1 in FIG. 1) of which the center corresponds to the center of the resist line pattern formed by the first lithography in a space group of the final line and space shape formed by the SAQP will be called an initial core in the following. Further, a final space portion obtained from a film deposited on the outside of the side wall of the first resist pattern is defined as a second core (a space portion indicated by symbol 2 in FIG. 1), and the other space is defined as a gap (a space portion indicated by symbol 3 in FIG. 1).

In a dense line pattern created by the SAQP, there is a possibility of a systematic (that is, random) dimension variation which has not been found in other methods. Typical structures are illustrated in FIGS. 2 and 3. FIG. 2 shows a case where the CD of the finally formed line pattern is not even. A situation that the lines are formed thick and fine as illustrated in FIG. 2 is considered as a case where anisotropic film deposition occurs at the time of manufacturing. FIG. 3 shows a case where a space CD is not even. Various factors are considered in the unevenness of the space CD, which will be described below. While wafer managers generally pay attention to a dimension of the line pattern, the position of the line becomes deviated even though the dimension of the line pattern is formed correctly.

A critical dimension scanning electron microscope (hereinafter, referred to as CD-SEM) having a length measuring function has been generally used in inspection of fine patterns without limited to the SAQP. The reason is that the CD-SEM has high magnification and high measurement reproducibility. Furthermore, in recent years, an index for evaluating an output result of the pattern shown in a captured image is proposed not only a simple measurement of the CD or the pitch, and the function of the CD-SEM is increased. When using such a function, it has been indicated that an amount of exposure is insufficient since the CD of the pattern created by the lithography is large. It has been indicated a possibility that a focus setting of an exposure device is not normal since line-edge roughness (hereinafter, referred to as LER) of a line edge is large. Alternatively, dimensions of a plurality of patterns in an image have been calculated one by one. In addition, the accuracy has been improved, and a sufficient sensitivity has been achieved even with respect to the CD value equal to or less than 20 nm. Therefore, the CD-SEM has been an important tool for estimating a problem of a pattern forming process in a mass-production field.

However, the inspection using the CD-SEM becomes important and difficult more than ever in the SAQP process. The reason for importance is that there are a plurality of processes to be passed through such as a normal lithography (that is, exposure and development), twice-film formation, twice-etching, and twice-core pattern elimination until that a final pattern is formed. In a case where the CD is deviated from a target value in a simple lithography so far, a condition of the exposure process is inspected. In addition, exposure, development, film formation, etching, and eliminating the core pattern are performed one time even in the SADP. In the SAQP, the number of processes is increased, and thus a dimension abnormality easily occurs. In addition, the reason for difficulty in the specification is that the number of processes until a time when the final pattern is obtained is increased and thus there occurs a dimension abnormality to which problems of a plurality of processes are related. In the dimension inspection, there is a need to obtain a clue for specifying a process causing an abnormality not only simply inspecting the dimension. There is required an index or an algorithm for indicating a problem from the resultant pattern data to which the plurality of process is related.

In addition, an overlay deviation is also a problem besides the detection of the dimension abnormality in the SAQP process and the estimation of a problematic process. As illustrated in FIG. 3, the deviation of the space CD means that the following problems occur. In a case where the pattern is positioned as designed when the resist pattern is formed at the first time (that is, the pattern is formed at an appropriate position with respect to the pattern of the lower layer), it is determined that an amount of overlay between the layers is sufficiently small. Further, it is expected that the element performance is degraded by the overlay deviation. However, the position of the line pattern is deviated as a result of the SAQP. Therefore, a positional deviation between each pattern and the pattern of the lower layer or the upper layer becomes large. The overlay deviation is not possible to be recognized when the pattern is exposed. Therefore, there is a possibility to cause a defect of an unexpected element. However, a method of detecting such a defect has not been found yet.

The above-described difficulties are two necessary techniques of establishing an important dimension inspection method of an SAQP pattern. As a first technique, there is a technique of distinguishing the line pattern and the space pattern formed by different processes which look like similar but different. In this technique, a position of a space pattern where the first resist pattern (that is, the initial core) has been occupied among four categories of space patterns which are looked similar is specified. As a second technique, after the initial core is specified, an index corresponding to an abnormality in each process such as a first lithography and two times of film formations is calculated so as to calculate an actual overlay deviation amount.

As the simplest method of realizing the first technique, the ends of a line pattern group are set to be arranged in one image by taking a capturing range wide. However, in this method, an area which is not contained in one capture range of the image is not possible to be inspected. An important portion in creating a typical device is the vicinity of the center of the pattern group, and the inspection on an area away from the ends of the line pattern group is essential. A method of widening the size of the image may be considered. However, there is a need to improve hardware in order to realize the method. In addition, it takes a long time to capture a wide range with accuracy. Therefore, there are also demerits such that a throughput is reduced, and a large storage capacity is required for storing the image. Therefore, there is required a method of specifying a core position from a CD-SEM image where the ends of the line pattern group are not contained.

In the case of the SADP pattern, the method disclosed in PTL 1 is proposed. In the case of the SAQP, there are three categories of space patterns such as the initial core, the second core, and the gap. In the case of SADP, only the core and the gap are included. In PTL 1, edges formed by depositing a film on the outside of the core (that is, edges interposing the gap) are formed using a phenomenon that roughness becomes small compared to the edges on the right and left sides of the core area. The roughness of the edge (that is, a line edge roughness) is calculated for each edge, the edges on the right and left sides of the space are paired up, an average LER of the edge belonging to the set is calculated, and the set of edges having a large LER value is determined as belonging to the core.

CITATION LIST

Patent Literature

PTL 1: JP 2012-519391 A

SUMMARY OF INVENTION

Technical Problem

The inventors have performed inspections on a possibility to apply the method of PTL 1 into the SAQP. As a result, the application of the method into the SAQP is considered to be possible in principle. However, it is found out that a reliability of determination is degraded after more studying on this method.

The content studied by the inventors will be described below. In a case where a pattern is manufactured using the SAQP as illustrated in FIG. 1, the cross section of a line is determined by the second film formation and etching. A problem caused when the method of PTL 1 is applied will be described, and the edges of the lines in the drawing are numbered. In PTL 1, a difference is made between a new edge corresponding to the film surface and the edge corresponding to a side wall of the original pattern when a film is deposited on right and left of the core pattern. Therefore, the nature of the edge is averagely calculated for each space. As the nature of the edge, there is a signal shape corresponding to the edge. However, when taking the shape of a signal obtained from the pattern of FIG. 1(i) into consideration, an edge 101, an edge 104, an edge 105, and an edge 108 are assigned with the same signal shape. Therefore, the edges 104 and 105 which are edges of the space of the initial core are not distinguished from the edges 101 and 108 located on a side of the gap. Only the second core is identified.

Next, it will be considered a case where the LER of PTL 1 is used as the nature of the edge. When the LER is slightly transferred at every film formation, edges 102 and 107 obtained as a result of transferring the edges formed in the second film formation have small LERs compared to those of edges 103 and 106 obtained as a result of transferring the edges formed by the first lithography in FIG. 1(i). Furthermore, the edges 101 and 108 formed by the second film formation have the LERs smaller than those of the edges 102 and 107, and the edges 104 and 105 have the LERs smaller than those of the edges 103 and 106. As disclosed in PTL 1, focusing on the space, it is considered that an average of the LERs of both edges interposing the space is calculated. Then, the following problem may occur. First, the edges on both sides in the space interposing the gap have minimized LERs. Therefore, an average value becomes a minimum value of the original LER. However, in other spaces, a large LER value and an intermediate LER value are averaged. Therefore, a difference between the LER average value of the space interposing the gap and the LER average value of the other space is hardly distinguished. Second, it cannot be said that the exactly same LER is reduced by the first film formation and the second film formation. When an effect of decreasing the LER in the second film formation is large, the LER average value of the edges interposing the initial core and the LER average value of the edges interposing the gap can be considered as almost the same degree. Third, the LERs of the right and left edges may be slightly different as a result of the lithography and the etching. Even in such a case, the LERs are averaged, and thus it is not possible to distinguish the difference. For these problems, when it comes to the actual pattern, the position of the initial core is frequently erroneously confused with that of the gap.

Further, a limited application may be considered in which only the portion of the second SADP is used without applying the method of PTL 1 to specify the initial core (that is, only the second core is specified). However, even in this case, there is a problem. When observing in the stage of FIG. 1(h), there can be made a distinction. However, in the stage of FIG. 1(i), in a case where the conditions for the etching and the resist elimination are appropriate, all the line patterns are formed to have the same cross-sectional shape, and also the surface of a foundation has the same physical nature, the shapes of the side walls of the edges 101, 104, 105, and 108 and the shapes of the side walls of the edges 102, 103, 106, and 107 become similar. Even in the stage of FIG. 1(h), when the influence of the film deposition becomes less, and a rounding portion at the top comes to be flat, the edges cannot be distinguished as illustrated in FIG. 1(i). Therefore, clearness in judgment is lowered even in the identification of the second core by the application of PTL 1.

Furthermore, there is no specific solution of the second technique in this situation. For example, even if an image of a wide view is obtained and the position of the initial core can be seen, it is not possible to specify a problem in the process only using simple data of the line CD and the space CD of the related art. In addition, an actual overlay deviation cannot be detected.

In order to find out a problem in the SAQP process using the current method and device from such a situation, there is no choice but to insert a wafer to the CD-SEM for inspection after the respective processes such as the first lithography and the film formation. However, in that case, costs of the inspection are increased, and also it takes a long time. Such a problem is also the same even in a case where the SADP is performed three times not only the SAQP.

As described above, there is no methods and devices which perform the CD-SEM observation on the final line pattern group formed by the process of performing the SADP two or more times to detect a problem on the process with accuracy while maintaining a high throughput, and can calculate an index for obtaining the overlay deviation with respect to the lower layer of each pattern with accuracy.

An object of the invention is to provide a charged particle beam device and an inspection device which can specify a position of an initial core with accuracy even in a case where fine line and space patterns are formed using the SADP in plural times.

Solution to Problem

An embodiment for achieving the object is a charged particle beam device, including:
a charged particle source;
a sample stage that is used to place a sample having a pattern of a plurality of lines, the lines being formed by performing a process two or more times in which a first pattern of a line shape formed on a stacked film is covered and a second pattern of a line shape is formed on both side walls of the first pattern by film deposition;
an irradiation optical system that emits charged particles discharged from the charged particle source as a charged particle beam toward the sample placed on the sample stage;
a detector that detects secondary charged particles discharged from the sample by emission of the charged particle beam;
a display unit that displays image data of a surface of the sample that is obtained on the basis of a signal of the secondary charged particles detected by the detector;
a calculation unit that calculates a line edge roughness value on the basis of the image data, the line edge roughness value being an index of roughness of a line edge of the pattern of the plurality of lines that are adjacent in parallel in the sample; and
a determination unit that compares the line edge roughness values in the pattern of the plurality of lines, and determines a position of an initial core that is a center of the first pattern.

Furthermore, a charged particle beam device includes:
a charged particle source;
a sample stage that is used to place a sample having a pattern of a plurality of lines, the lines being formed by performing a process two or more times in which a first pattern of a line shape formed on a stacked film is covered and a second pattern of a line shape is formed on both side walls of the first pattern by film deposition;
an irradiation optical system that emits charged particles discharged from the charged particle source as a charged particle beam toward the sample placed on the sample stage;
a detector that detects secondary charged particles discharged from the sample by emission of the charged particle beam;
a display unit that displays image data of a surface of the sample that is obtained on the basis of a signal of the secondary charged particles detected by the detector;
a calculation unit that calculates a similarity in shape of right and left edges of a plurality of spaces that are adjacent in parallel in the sample on the basis of the image data; and
a determination unit that determines a position of a second core that is the second pattern formed on both sides of the first pattern on the basis of a similarity in shape of right and left edges in the pattern of a line or the space.

Furthermore, a charged particle beam device includes:
a charged particle source;
a sample stage that is used to place a sample having a pattern of a plurality of patterns of a line shape, the patterns of line shape being formed by performing a process two or more times in which a first pattern of a line shape formed on a stacked film is covered and a second pattern of a line shape is formed on both side walls of the first pattern by film deposition;
an irradiation optical system that emits charged particles discharged from the charged particle source as a charged particle beam toward the sample placed on the sample stage;
a detector that detects secondary charged particles discharged from the sample by emission of the charged particle beam;
a display unit that displays image data of a surface of the sample that is obtained on the basis of a signal of the secondary charged particles detected by the detector;
a similarity calculation unit that calculates a similarity in roughness shape of the adjacent edges interposing a space of the plurality of the patterns of line shape or a variation along a longitudinal direction of a line at a center position of the line with respect to the plurality of the patterns of line shape that are adjacent in parallel, and calculate a similarity in shape of a center variation of the adjacent lines as a center variation of the line;

a position determination unit that determines a position of a pattern of a line shape formed before final film deposition on the basis of the similarity of roughness shape of the edge or the similarity in shape of the center variation;

a roughness calculation unit that calculates a line edge roughness value, the line edge roughness value being an index of roughness of the line edge of the plurality of the patterns of line shape that are adjacent in parallel; and an initial core determination unit that determines a position of an initial core that is a center of the first pattern on the basis of a position of the pattern of a line shape formed before the final film deposition and the line edge roughness value.

Furthermore, an inspection device includes:

a display unit that displays image data of a surface of a sample obtained by emitting a charged particle beam onto the sample having a plurality of patterns of line shape, the patterns of line shape being formed by performing a process two or more times in which a first pattern of a line shape formed on a stacked film is covered and a second pattern of a line shape is formed on both side walls of the first pattern by film deposition;

a calculation unit that calculates a line edge roughness value on the basis of the image data, the line edge roughness value being an index of roughness of a line edge of the plurality of patterns of line shape that are adjacent in parallel in the sample; and a determination unit that compares the line edge roughness values in the pattern of the plurality of patterns of line shape, and determines a position of an initial core that is a center of the first pattern.

Furthermore, an inspection device includes:

a display unit that displays image data of a surface of a sample obtained by emitting a charged particle beam onto the sample having a plurality of patterns of line shape, the patterns of line shape being formed by performing a process two or more times in which a first pattern of a line shape formed on a stacked film is covered and a second pattern of a line shape is formed on both side walls of the first pattern by film deposition;

a calculation unit that calculates a similarity in shape of right and left edges of a plurality of spaces that are adjacent in parallel in the sample on the basis of the image data; and a determination unit that determines a position of a second core that is the second pattern formed on both sides of the first pattern on the basis of a similarity in shape of right and left edges in the pattern of a line shape or the space.

Furthermore, an inspection device includes:

a display unit that displays image data of a surface of a sample obtained by emitting a charged particle beam onto the sample having a plurality of patterns of line shape, the patterns of line shape being formed by performing a process two or more times in which a first pattern of a line shape formed on a stacked film is covered and a second pattern of a line shape is formed on both side walls of the first pattern by film deposition;

a similarity calculation unit that calculates a similarity in roughness shape of the adjacent edges interposing a space of the plurality of patterns of line shape or a variation along a longitudinal direction of a line at a center position of the line with respect to the plurality of patterns of line shape that are adjacent in parallel, and calculate a similarity in shape of a center variation of the adjacent lines as a center variation of the line;

a position determination unit that determines a position of a pattern of a line shape formed before final film deposition on the basis of the similarity of roughness shape of the edge or the similarity in shape of the center variation;

a roughness calculation unit that calculates a line edge roughness value, the line edge roughness value being an index of roughness of the line edge of the plurality of the patterns of line shape that are adjacent in parallel; and an initial core determination unit that determines a position of an initial core that is a center of the first pattern on the basis of a position of the pattern of a line shape formed before the final film deposition and the line edge roughness value.

Advantageous Effects of Invention

According to the invention, it is possible to specify a position of an initial core even in a case where a pattern is formed using a SADP in plural times.

BRIEF DESCRIPTION OF DRAWINGS

FIGS. 1(a) to 1(f) illustrate a pattern forming process by a first SADP, and FIGS. 1(g) to 1(i) illustrate a pattern forming process by a second SADP.

FIG. 4 is a cross-sectional view of a fine pattern to which the invention is applied; FIG. 4(a) illustrates an image (top view) observed from a vertical upward side, and FIG. 4(b) illustrates a cross-sectional view.

FIG. 5(a) is a top view schematically illustrating an image observed from a vertical upper side of the pattern when a side wall of the fine pattern is covered to stack a film and etched to form a film in the side wall of the fine pattern; FIG. 5(b) is a cross-sectional view schematically illustrating the pattern when the side wall of the fine pattern is covered to stack a film.

FIG. 6 is a cross-sectional view schematically illustrating a pattern which shows a measuring place in the invention.

FIG. 11 is an exemplary graph of measurement results displayed in the operation terminal screen in the first embodiment of the invention.

FIG. 12 is a cross-sectional view illustrating a pattern in the middle of a pattern forming process estimated in the first embodiment of the invention.

FIG. 13 is an exemplary table of measurement results displayed in the operation terminal screen in the first embodiment of the invention.

FIG. 15(a) shows a table showing center positions of the respective patterns with respect to the origin of an x axis, and FIG. 15(b) shows a screen for inputting a design value of a pitch of a line pattern and an overlay deviation amount.

FIGS. 17(a) to 17(c) show a pattern forming process by a first SADP, FIGS. 17(d) and 17(e) show a pattern forming process by a second SADP, and FIGS. 17(f) and 17(g) show a pattern forming process by a third SADP.

FIG. 19 is an exemplary table showing LER values which are calculated in the third embodiment of the invention and displayed in the operation terminal screen.

DESCRIPTION OF EMBODIMENTS

Figure 1:
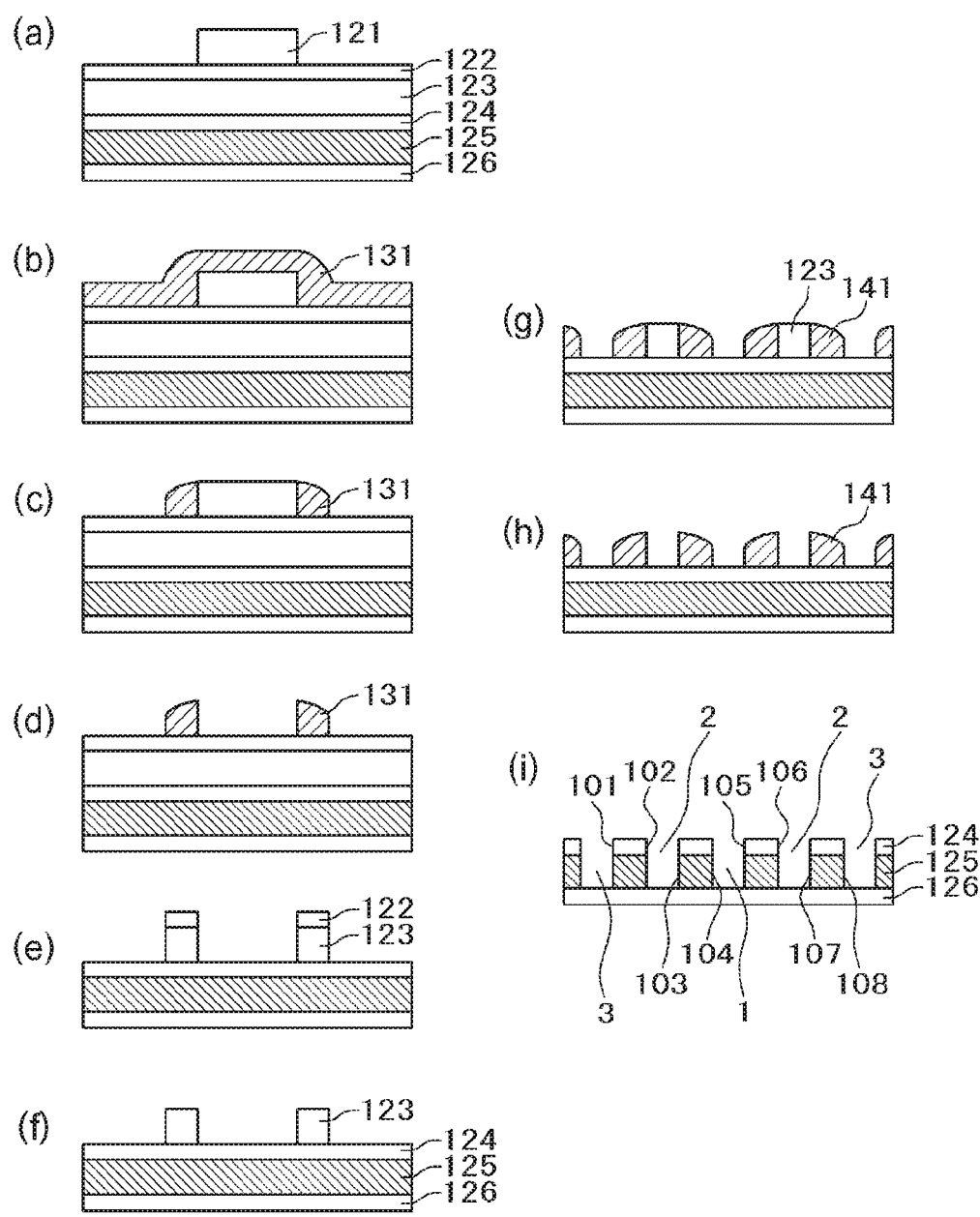
FIG. 1 is a cross-sectional view schematically illustrating a pattern for describing a process when fine lines and spaces are formed using SAQP.
Figure 2:
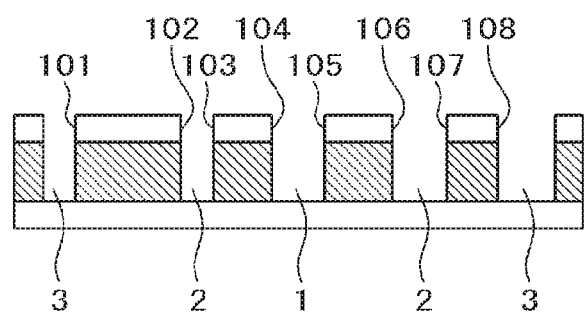
FIG. 2 is a diagram schematically illustrating an example of a pattern cross-section in a case where a distribution (dimension variation) occurs in a line width of the fine line pattern formed using the SAQP.
Figure 3:
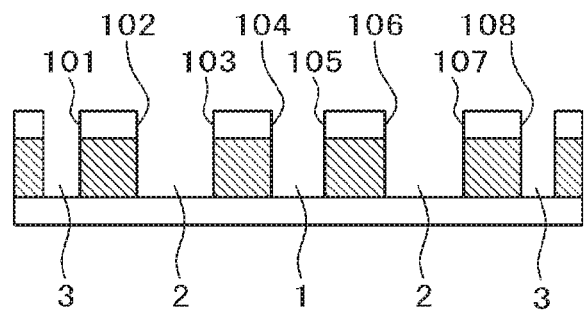
FIG. 3 is a diagram schematically illustrating an example of a pattern cross-section in a case where a distribution (dimension variation) occurs in a space width of the fine line pattern formed using the SAQP.

The invention includes any one of configurations that a distribution of LER values of a pattern edge is obtained from a CD-SEM image where the ends of a line pattern group are not contained, that a similarity in shape of the right and left edges of a space or a similarity in variation along a line at the center position of adjacent lines is obtained, that a position of a line pattern formed by a first lithography of SAQP after the former data set or a combination between the former and the latter, and that an overlay deviation amount and a dimension index corresponding to a dimension of the pattern which is formed through a first lithography, a first film formation, and a second film formation are calculated. Further, the invention can be applied to all the pattern forming methods in which an SADP is performed two or more times. However, the description herein will be representatively made using the case of the SAQP.

Before explaining the method, the description will be made about an exemplary method of calculating the LER value, the similarity in shape of the right and left edges of the space, and the similarity in variation along the line at the center position of the adjacent lines.

First, the LER value will be described below. The CD-SEM image illustrated in FIG. 4(a) is acquired. In the image, a direction in parallel to the line is set to a y direction, and a vertical direction is set to an x direction. A cross-sectional diagram of an observation target corresponding to the CD-SEM image of FIG. 4(a) is illustrated in FIG. 4(b). Portions drawn with an inclined lattice pattern of FIG. 4(a) correspond to the space areas. Next, numbers are attached to the edges of the line patterns in the image. For example, the numbers of 1, 2, and so on are assigned from left to right of the image. In this case, the numbers 1, 2, 3, and so on of the edges are denoted as symbols 401, 402, 403, 404, 405, 406, 407, 408, 409, and 410 for distinction from the numbers in the other drawings in FIG. 4. The edges attached with the same number in FIGS. 4(a) and 4(b) mean the same edge. The odd numbers are attached to the left edges of the lines, and the even numbers are attached to the right edges. The symbols 412, 414, 416, 418, and 420 indicate line portions, and the symbols 411, 413, 415, 417, 419, and 421 indicate space portions. Hereinafter, the edge number is denoted by $E\_n$. Furthermore, a set of edge points indicating each line edge is obtained by an image processing. The edge points contained in the edge having the edge number $E\_n$ are represented as a set of the x coordinate thereof. In other words, the edge point becomes $\{x(i, E\_n)|i=1, 2, 3 \ldots P\_n\}$. Herein, the line edge is assumed to be defined by $P\_n$ points. This quantity is expressed by a function of the number $E\_n$ of the line edge, and a point number i (which is assigned in an ascending order from a small number of the y axis coordinate) in the edge. In addition, the y coordinate $y(i, E\_n)$ of the i-th edge point is assigned as follow.

$$y(i, E\_n) = \Delta y \cdot i \quad \text{(Expression 1)}$$

Next, the line edge is approximated to a straight line, and a deviation from the approximated straight line of the x coordinate of each edge point is expressed as $\Delta x(i, E\_n)$. Roughness of the $E\_n$-th line edge is expressed by $\{\Delta x(i, E\_n)|i=1, 2, 3 \ldots P\_n\}$ which is a set of deviation amounts.

The LER value is a magnitude of roughness of one edge which is obtained from the set. A value three times the standard deviation is widely used which is defined in the following.

[Expression 2]

$$3\sigma(E\_n) = \sqrt{\frac{1}{P\_n \cdot (P\_n - 1)} \sum_{i=1}^{P\_n} \Delta x(i, E\_n)^2} \quad \text{(Expression 2)}$$

This is an example, the numerical value "3" on the left side may be set to "1", "2", or "6", and a difference between a maximum value and a minimum value of $\Delta x(i, E\_n)$ belonging to a certain edge may be used as the LER value.

Next, the description will be made about a similarity in shape of the right and left edges of the space. This similarity represents a similarity of two sequences of $\{\Delta x(i, E\_n)|i=1, 2, 3 \ldots P\_n\}$ and $\{\Delta x(i, E\_n+1)|i=1, 2, 3 \ldots P\_n\}$ when the edge on the left side of a certain space is the $E\_n$-th edge. An example of an index of the similarity is as follow.

[Expression 3]

$$\rho\_s(E\_n) = \frac{1}{\sigma(E\_n) \cdot \sigma(E\_n+1)} \cdot \sum_{i=1}^{P\_n} \Delta x(i, E\_n) \cdot \Delta x(i, E\_n+1) \quad \text{(Expression 3)}$$

That is, this expression shows a standardized correlation coefficient of two sequences.

Finally, the description will be made about an exemplary method of calculating a similarity in variation of the center position of the adjacent lines. First, the center positions of one line are obtained by a set $\{x\_c(i, L\_n)|i=1, 2, 3 \ldots P\_n\}$ of center points between the edge points of the left edge and the edge points of the right edge (that is, simply average values between the x coordinates of the left edge and the x coordinates of the right edge of the line). Herein, $L\_n$ represents a line number, and has the following relation with $E\_n$.

[Expression 4]

$$E\_n = 2 \cdot L\_n - 1 \quad \text{(Expression 4)}$$

[Expression 5]

$$E\_n = 2 \cdot L\_n \quad \text{(Expression 5)}$$

Next, similarly to the case of obtaining the LER value, the approximation is also performed on $\{x\_c(i, L\_n) | i=1, 2, 3 \ldots P\_n\}$ to obtain a deviation amount $\{\Delta x\_c(i, L\_n) | i=1, 2, 3 \ldots P\_n\}$ from the approximated straight line. The similarity in variation at the center position of the adjacent lines is the similarity of two sequences $\{\Delta x\_c(i, L\_n) | i=1, 2, 3 \ldots P\_n\}$ and $\{\Delta x\_c(i, L\_n+1) | i=1, 2, 3 \ldots P\_n\}$. An example of an index of the similarity is as follow.

[Expression 6]

$$\rho\_c(L\_n) = \frac{1}{\sigma\_c(L\_n) \cdot \sigma\_c(L\_n+1)} \sum_{i=1}^{P\_n} \Delta x\_c(i, L\_n) \cdot \Delta x\_c(i, E\_n+1) \quad \text{(Expression 6)}$$

Herein, $\sigma\_c(L\_n)$ is a standard deviation of $\{\Delta x\_c(i, L\_n) | i=1, 2, 3 \ldots P\_n\}$.

Hereinafter, the content of the invention will be described using the above index. A pattern forming process is as illustrated in FIG. 1. Further, a process may be added in which a silicon oxide film is buried in a gap (that is, a space portion) of the formed patterns, and the original line portion is eliminated by etching while remaining the silicon oxide film. Therefore, a positive-negative reverse can be made by reversing a relation between the line and the space. Herein, it is assumed a process of removing all the core patterns for the sake of simplifying the explanation. Further, the following method may be performed on the pattern formed by performing the positive-negative reverse while exchanging the relation between some lines and spaces.

In the following, a method of specifying an initial core will be described. The description will be made about transferring of an edge shape at the time of forming the line by film deposition which is a premise in this method. FIG. 5(a) is a top view schematically illustrating an edge of the line pattern obtained such that a film is stacked on the core pattern, a core portion is exposed by performing etching, and then the core is eliminated. FIG. 5(b) is a cross-sectional view schematically illustrating the pattern when the film is stacked on the core pattern. The edges denoted with the same number in FIGS. 5(a) and 5(b) correspond to each other. The symbol 501 indicated with the broken line in FIG. 5(a) is the line edge corresponding to the surface of the stacked film. The symbol 502 indicated with the solid line is the line edge of the core pattern.

When the LER is present in the edge of the original core pattern, there is left a roughness even the film is stacked. Therefore, a left edge 501 of the line of FIG. 5(b) has the roughness resembling a right edge 502. However, a fine roughness is generally smoothened when the film is stacked. Therefore, the LER of the left edge 501 has a smaller value than that of the right edge 502. Hereinafter, such a structure will be called an LER transfer model.

However, since the condition of the film deposition process is not optimized sometimes, the LER of the edge 501 becomes larger than that of the edge 502. In such a case, the stacking is not made even in film thickness. Therefore, there is a possibility that the performance of the finally obtained device is significantly lowered. In order to apply the invention, there is a need to perform monitoring such that the film deposition condition is correctly kept or monitoring a film thickness change using a reference pattern on a wafer. If the film thickness change becomes large, and in a case where the device is manufactured in that state, an analysis is performed such that the magnitudes of the LER values are set to be reverse thereafter.

According to the model illustrated in FIG. 5, 3σ (that is, the LER) of an edge 108 is obtained according to (Expression 2) from eight edges 101 which are aligned as the initial core in the center portion illustrated in FIG. 1(i). The magnitudes of LER values become small, intermediate, large, intermediate, intermediate, large, intermediate, and small. A portion where the edges having an intermediate LER value are aligned is the initial core, and a portion where the edges having a small LER value is the gap. In other words, inversely, the LER value is calculated from the data of the line edge, and the position of the initial core can be known from the magnitude of the distribution. However, as described in the problem when PTL 1 is applied, there is a small difference between the portion having an intermediate LER and the portion having a small LER even when they are directly compared.

Therefore, an edge having a large LER value and an edge having a small LER value are specified in the invention. Specifically, first, a plurality of edges are numbered as it goes from one direction to the other direction in the image. When a sequence of the LER values is created, the values are necessarily arranged in an order of the numbers. Next, an initial core position is assumed. An edge number dependency of a magnitude (distribution of three types of values; large, intermediate, and small values) of the LER value estimated on the basis of the assumption is compared with an edge number dependency of an actual LER measurement value to calculate a similarity therebetween so as to determine whether these two are matched. The determination may be performed while changing the assumed position of the initial core. While an edge having a large LER value does not face the initial core or the gap, it can be found out where the initial core is as a whole as long as the edge is identified. This method hereinafter will be called a first method of specifying the initial core.

However, when the LER of a line derived of the first resist line by film deposition (hereinafter, referred to as a second core) is sufficiently smoothened, the LER of the newly generated edge may be not smoothened so much even when the film deposition is further performed on the side wall of the line edge to form the final line. In other words, the intermediate LER may be almost the same as the large LER, and it is hardly estimated whether the intermediate LER is approximated to a value of the small LER or to a value between the large LER and the small LER. Therefore, the above method may be corrected as follows. First, the edges are numbered as it goes from one direction to the other direction in the image similarly to the above method. When a sequence of the LER values is created, the values are necessarily arranged in an order of the numbers. Next, an initial core position is assumed. A sequence of new LER values is created only by the LER measurement values of the edges which normally become the large LER values and the LER measurement values of the edges which normally become the small LER values on the basis of the assumption. It is determined whether the sequence is equal to a distribution of the estimated LER values (a distribution of two large and small values). The determination may be performed while changing the assumed position of the initial core. Through this correction, a calculation time is increased, but the accuracy in determination is improved. In a case where the determination accuracy has priority over the calculation time, this method may be suitable. This method hereinafter will be referred to as a second method of specifying the initial core.

While the specification of the initial core is not possible, there is a method of effectively specifying the second core. Next, the method will be described. The second core is a line which is formed by film deposition on the side wall of the resist line before becoming a space. Therefore, according to the LER transfer model, the left edge and the right edge of the second core are similar. Thus, the similarity between the edge shape of the left edge and the edge shape of the right edge may be calculated with respect to the entire space pattern shown in the top view image obtained in observation using the CD-SEM. As an example of the similarity, (Expression 3) may be used. However, only any one of the right and left edges of the space may be largely affected by noises when the final pattern is electrically charged. In this case, the similarity becomes small, and the second core is hardly specified. At that time, the similarity in variation at the center position of the adjacent lines narrowly spaced according to (Expression 4).

As a result of the above procedure, the space having a high similarity is the second core. Furthermore, there is a method of improving accuracy in determination instead of simply determining a high similarity space as the second core. In a pattern formed by the SAQP, there is used a fact that the similarity in shape of the right and left edges does not come to be high while the arranged spaces are formed with the second core, the initial core, the second core, and the gap which are repeatedly arranged. Specifically, the spaces are numbered in an order of arrangement, and a space number dependency of the similarity of the right and left edges of the space is obtained. Then, the space number dependency of the similarity is normally repeatedly increased and decreased, and a large portion becomes the second core.

The invention obtains a higher accuracy more than that obtained by a method in which the method disclosed in PTL 1 is applied to the SAQP to specify only the second core without specifying the initial core. The reason is that the line formed by film deposition is originally desirable to be formed bisymmetrically. Therefore, the line can be formed almost symmetrically by studying an etching process. In this case, a difference in signal waveforms between the original edge and the edge formed by film deposition is extremely small. However, since the magnitude of the LER is left, the second core can be specified with a high accuracy when the invention is employed.

Returning to the beginning object, the second core may be obtained at the beginning in order to obtain the initial core with a high accuracy. It can be seen that, when the spaces are numbered with 1, 2, 3, and so on, the number of the space corresponding to the second core becomes any one of "1" and "3" (mod 4) or "2" and "0" (mod 4) on the basis of the method of using the similarity of the right and left edges of the space. Therefore, the candidates of the initial core is narrowed into two cases; in the former case, "2" or "0" (mod 4), and in the latter case, "1" or "3" (mod 4). When the initial core is obtained excepting the process, a probability is evaluated with respect to all the cases where the initial core corresponds to the spaces 1, 2, 3, and 4, and a correct solution is derived from the four spaces. However, the identification can be made with a higher accuracy by narrowing the candidates into two groups at the beginning. With this method, the accuracy is improved compared to the method of directly obtaining the initial core, while it takes a long calculation time.

Hitherto, the description has been made about the method of specifying the initial core. Next, the dimension index will be described for estimating a problem in a pattern forming process after the initial core position is specified.

The most fundamental index is a width of the line pattern. Hereinafter, the width is denoted as CDL_final. The second film formation is performed between FIGS. 1($f$) and 1($g$) while not illustrated in FIG. 1, and the resultant CD_final will be constant regardless of the line number if the film is evenly deposited. However, a periodical change may appear in the CDL_final depending on a difference in chemical nature of the surface of the foundation and a distance between patterns of the second core. Therefore, there are proposed a width of the line interposing the initial core, a width of the line interposing CDL_finalcore and a gap, and CDL_finalgap. In a case where data of a plurality of places is acquired, an average value between CDL_finalcore and CDL_finalgap may be used in place of simply using an average of the width CDL_final of the line. The former one is a dimension of the line which is formed at a position where the resist pattern was formed, and the latter one is a dimension of the line which is formed at a position where the space area was formed. In other words, since the lines are formed through a different procedure, an influence of the resist pattern can be found when there is a difference between these amounts. Similarly, there is a width of the space pattern as an important dimension index. Aperiodic change of the value mainly depends on unevenness in the first film formation process. A factor of causing such unevenness is the same as that in the case of CDL_final. The index itself is the same as the space width which has been measured in the related art, but it can make discrimination if the position of the initial core is given. The influence of the process can be separated by comparing CDS_initcore (the space width of the initial core), CDS_2ndcore (the space width of the second core), and CDS_gap (the space width of the gap). In a case where there are a plurality of pieces of data, an average value may be used. For example, when CDS_2ndcore is unusually small, it means that the film deposition amount is insufficient in the first film formation (the details will be described in an embodiment).

An index indicating the dimension is illustrated in FIG. 6. The symbol 601 is CDL_finalcore, the symbol 602 is CDL_finalgap, the symbol 603 is CDS_initcore, the symbol 604 is CDS_2ndcore, and the symbol 605 is CDS_gap. In the invention, novel indexes will be proposed in the following. These indexes are CD_core denoted by the symbol 606 in FIG. 6 and CD_gap denoted by the symbol 607. The former one corresponds to the resist pattern dimension which is formed at the beginning. However, since the resist pattern is subjected to the etching process, the index does not become exactly the same value as that in the resist pattern dimension at the beginning. These two indexes are used to determine whether the abnormality in dimension or pattern position is related to the resist pattern dimension at the beginning. When the data can be acquired from a plurality of places, the index may be averaged.

An effective overlay error can be calculated when the initial core can be specified. By specifying the initial core, it is possible to specify an edge to which the edge of the first resist pattern is transferred. In FIG. 6, two edges are illustrated where CD_core denoted by the symbol 606 are assigned. The center of the two edges on the x coordinate is set as a reference point. In order to obtain an overlay error of each line pattern with respect to the pattern of the lower layer, the x coordinate of the center of each line pattern is obtained, and the deviation amount from the reference point is added to the overlay error calculated when the resist pattern is formed at the beginning.

In the invention, a problem estimation of the process and the evaluation on the overlay deviation can be made from the final pattern image created by the SAQP process, which has not been possible so far. Since the LER of each edge and the edge shape in the image, and a distance between specific edges are calculated, there is no need to capture the end of the line pattern group. Further, an important area due to the device performance can be directly inspected. In addition, it is sufficient to capture an image having a view angle in which one side is about several hundreds of nanometer. Therefore, a time taken for capturing the image is equal to that in the related art. A storage area for storing the image is also equal to that in the related art. In other words, the evaluation on the process can be made without degrading costs and throughput, which has not been possible so far. Hereinafter, embodiments of the invention will be described in detail Further, the invention of the present application will be mainly described about an example of CDSEM, but measuring and inspecting of a length of the pattern may be performed in another device. For example, a general-purpose critical dimension scanning electron microscope may be used, or a charged particle beam device such as an ion microscope, a transmission electron microscope, and a scanning transmission electron microscope may be used. In addition, there is no need to use a device integrated with the charged particle beam device as long as a calculation device using information of obtained patterns can be used.

In addition, a detection target of a detector will be mainly described using a secondary electron, but a charged particle such as a reflected electron, a mirror electron, an ion emitted from a sample can be detected and realized.

First Embodiment

A first embodiment of the invention will be described below. The description in this embodiment will be made about an example in which the initial core is specified while focusing on the accuracy rather than the calculation time from the image of the pattern formed by the already acquired SAQP, and a dimension measurement is performed to estimate a problem in process and to improve a yield.

Figure 7:
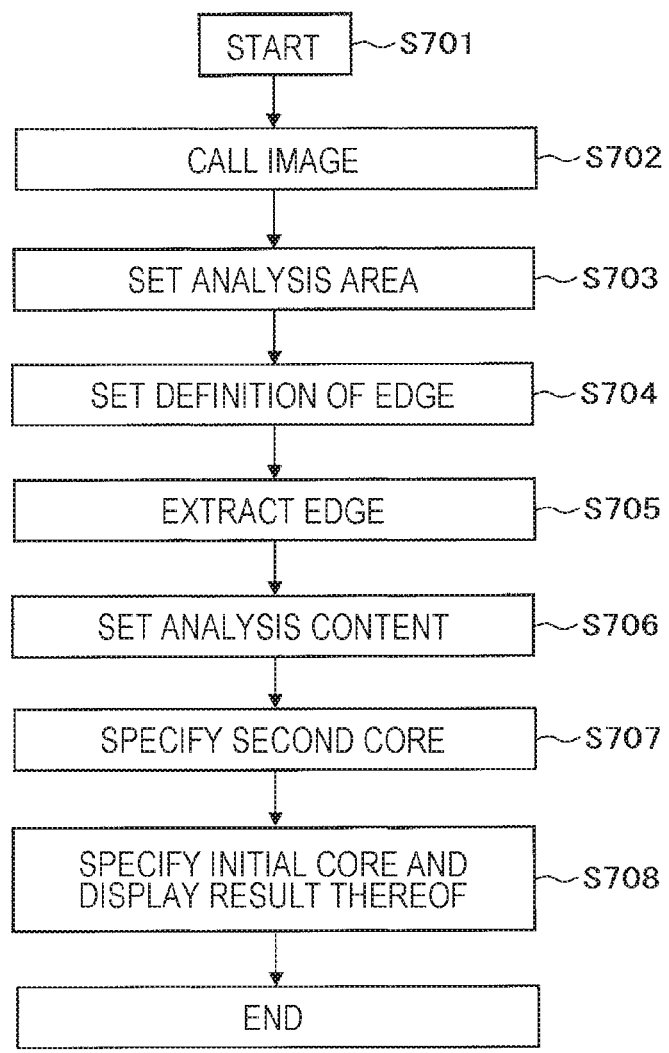
FIG. 7 is an exemplary flowchart for specifying an initial core described in a first embodiment of the invention.
Figure 8:
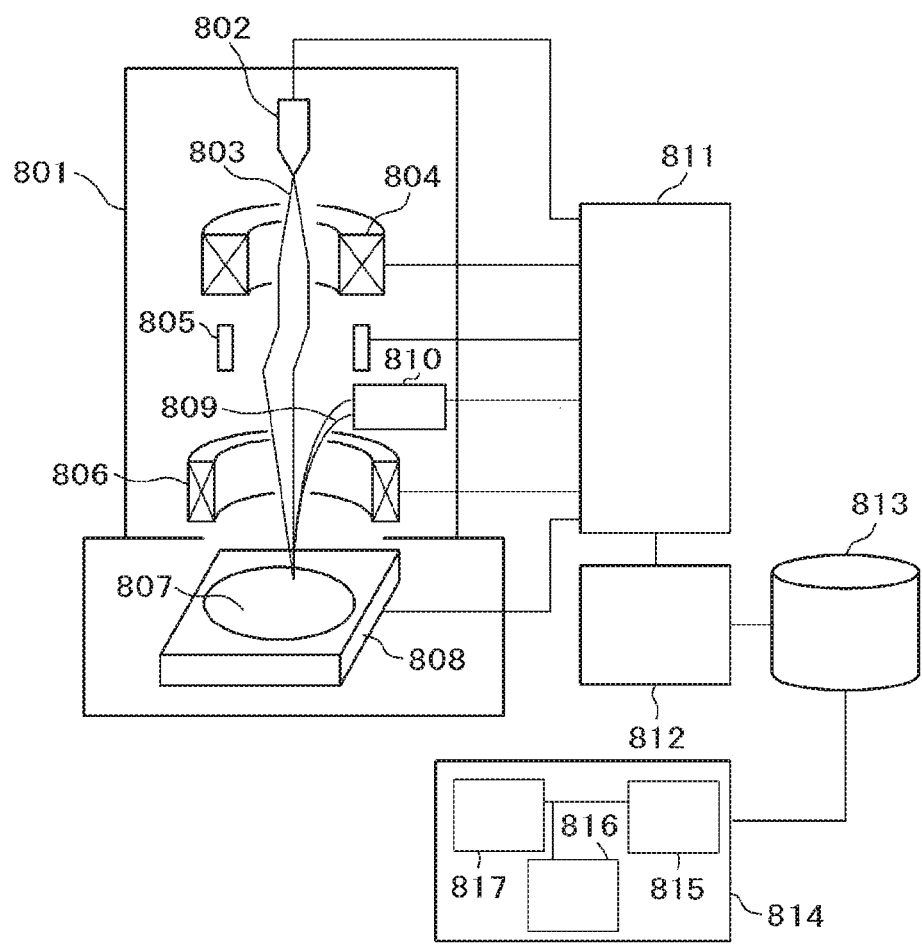
FIG. 8 is a conceptual diagram (partial cross-sectional view) illustrating a scanning electron microscope (inspection device) used in the invention.
Figure 9:
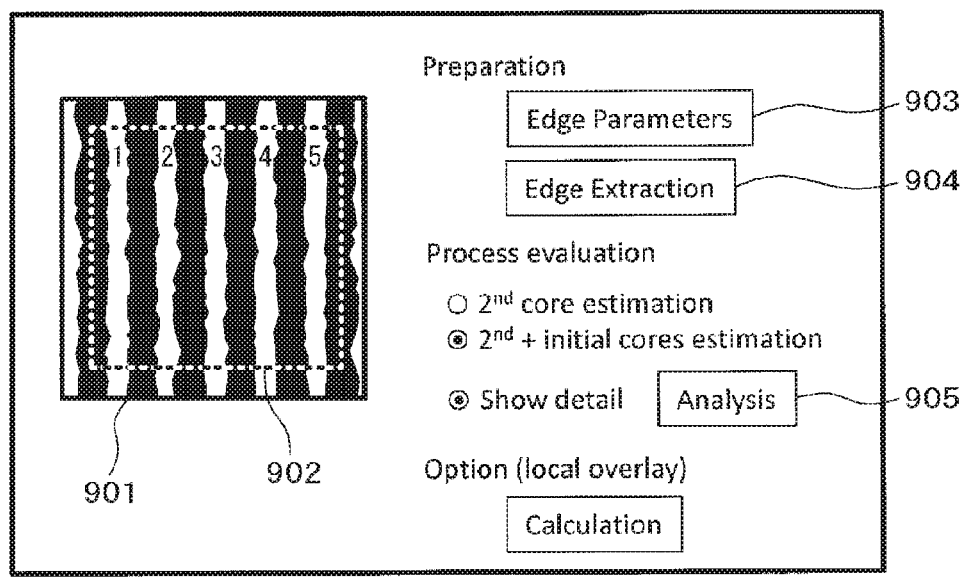
FIG. 9 is a diagram schematically illustrating a window displayed in an operation terminal screen in the first embodiment of the invention.
Figure 10:
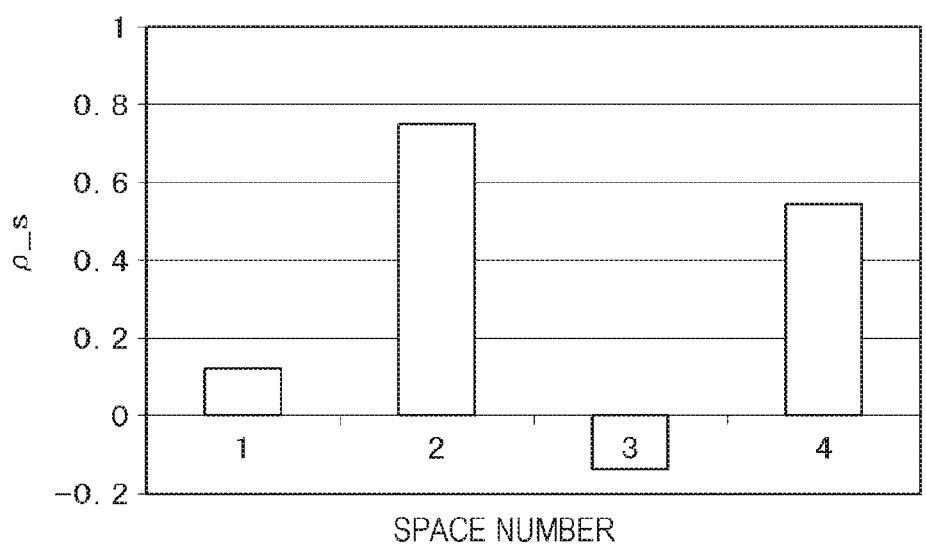
FIG. 10 is an exemplary graph of measurement results displayed in the operation terminal screen in the first embodiment of the invention.

FIG. 4(a) is a diagram schematically illustrating an image of a line and space pattern analyzed in this embodiment. In addition, FIG. 4(b) is a diagram schematically illustrating a cross-sectional structure of the pattern. The pattern is manufactured by the process of FIG. 1 in which the cross-section is illustrated. The pattern which has a rectangular cross-section and formed in the uppermost surface in FIG. 1(a) is manufactured by immersion ArF lithography. In addition, FIG. 7 illustrates a flowchart of specifying the initial core which is used in this embodiment. FIG. 8 illustrates a conceptual diagram of a scanning electron microscope which contains configurations of a sample observation device and an analysis system used in this embodiment. In addition, FIGS. 9, 10, and 11 illustrate a schematic diagram of a window which appears in a monitor screen during an image analysis when the invention is implemented, and two graphs. In addition, FIG. 12 illustrates a cross-sectional view in a process in the middle of forming the pattern which is estimated as a result of the application of the invention. In addition, FIG. 13 illustrates a diagram of an example in which a resultant table obtained finally is displayed in an operation terminal screen.

The fine line and pattern image is acquired using the SAQP before performing the flowchart of FIG. 7. A sample 807 is placed on a sample stage 808 of the scanning electron microscope, an electron beam 803 from an electron gun 802 is emitted to the sample 807 by an electron optical system (irradiation optical system) which includes lenses 804 and 806 and a deflector 805, a secondary electron 809 generated from the sample is detected by a detector (detection optical system) 810, and the image data is stored in a data storage device 813 on the basis of a detected signal through a control system 811 of each portion of the scanning electron microscope and a terminal (that is, a calculation unit which calculates a result obtained from the detector as image data) 812 of the sample observation device and the analysis system. Further, the symbol 801 is a housing of the scanning electron microscope.

Next, an operator operates a terminal of an image analysis device 814 through which data can be transmitted and received with respect to the scanning electron microscope which includes the sample observation device and the analysis system, and causes a program to execute the initial core specification (Step S701). Next, the image data is called from the data storage device 813, and displayed in the monitor screen of the image analysis device 814 (Step S702). In other words, the image analysis device 814 includes an input/output unit 815 which calls the image data from the data storage device 813, a determination unit 816 which executes a program to determine the initial core and the second core, and a display unit 817 which displays the determination result. In addition, while not illustrated, the display unit may be provided in the terminal (the calculation unit) 812 of the analysis system. The input/output unit and the determination unit may also be assembled to the scanning electron microscope or the image analysis device, or may be assembled to other devices within a scope to solve the problem of the application.

A window displayed by the operation is illustrated in FIG. 9. The called image is denoted by the symbol 901.

Next, the operator proceeds to Step S703, and sets an area to be analyzed on the image 901. The setting area is denoted by a frame 902 depicted with a broken line.

Next, the operator proceeds to Step S704, and inputs a definition of an edge. Specifically, a button 903 of "Edge Parameters" displayed in the screen is clicked. Then, a parameter setting window for defining the edge of the line pattern appears, and the operator inputs a definition of the edge.

Next, the operator proceeds to Step S705, and clicks a button 904 of "Edge Extraction" to extract the edge. Then, the line patterns in the frame (analysis area) 902 of the broken line of the image 901 are numbered (1, 2, 3, 4, and 5) from the left side. These numbers correspond to line patterns 412, 414, 416, 418, and 420 illustrated in FIG. 4. In addition, the edge is displayed as a set of points on the image.

Next, the operator proceeds to Step S706, and select to obtain only the second core in a core specification algorithm or also to obtain the initial core after obtaining the second core. The operator selects to obtain the initial core after obtaining the second core, and clicks a select mark on the left side of the display of "$2^{nd}$+initial cores estimation". In addition, since the operator wants to display ρ_s and the LER value which are calculated when a core is specified, the operator clicks a select mark on the left of the display of "Show detail". Further, herein, while the initial core is obtained after the second core is obtained, the initial core may be directly obtained in the algorithm as described above.

Thereafter, the operator clicks a button 905 of "Analysis" to execute an analysis of the initial core specification.

Then, Δx(E_n, i) is calculated from position information of the edges (of which the edge numbers E_n are 1 to 10 corresponding to edges 401 to 410 illustrated in FIG. 4) of the lines 1 to 5 in the image analysis device 814. Herein, i is a value within 1 to 256. In other words, P_n=256. Next, ρ_s of the spaces having space number 1 to 4 (corresponding to spaces 411, 413, 415, and 417 in FIG. 4) are obtained according to (Expression 3). Further, the space number is equal to the line number on the left. In addition, the dependency of ρ_s to L_n is displayed using a graph in the operation terminal screen. The graph is shown in FIG. 10. The image analysis device 814 shows variation in the magnitude of result, and ρ_s of the space 2 (on the right side of the line 2 in the screen) and the space 4 are large. Therefore, these spaces are determined as the second core (Step S707).

Subsequently, the image analysis device 814 calculates the LER according to (Expression 2) from ten edges. In addition, the dependency of the LER to the edge number E_n is displayed as a graph in the operation terminal screen. The graph is shown in FIG. 11.

Next, the image analysis device 814 proceeds to Step S708, and specifies the initial core. The procedure is as follows. First, it is assumed that the initial core is the space 1 (the right side of the line 1 in the screen; that is, a space between the edge of E_n=2 and the edge of E_n=3). Under this assumption, the variation of the LER values of the edges 1 to 10 becomes large, intermediate, intermediate, large, intermediate, small, small, intermediate, large, and intermediate. When only the edges having the large or small E_n are excluded, it becomes 1, 4, 6, 7, and 9, and a series of magnitudes becomes 1, 1, 0, 0, and 1 when the large value is set to "1" and the small value is set to "0". Next, an extraction sequence of the LER values of the edges having E_n=1, 4, 6, 7, and 9 becomes 2.51, 2.79, 2.77, 2.44, and 2.42. The unit is nanometer. A correlation value of these two sequences becomes −0.10, and there is nearly no relation.

Next, the image analysis device 814 assumes that the initial core is the space 3 (the right side of the line 3 in the screen; that is, a space between the edge of E_n=6 and the edge of E_n=7). Under the assumption, the variation of the LER values of the edges 1 to 10 becomes intermediate, small, small, intermediate, large, intermediate, intermediate, large, intermediate, and small. When only the edges having the large or small E_n are excluded, it becomes 2, 3, 5, 8, and 10, and a series of magnitudes becomes 0, 0, 1, 1, and 0 when the large value is set to "1" and the small value is set to "0". Next, an extraction sequence of the LER values of the edges having E_n=2, 3, 5, 8, and 10 becomes 2.46, 2.58, 3.04, 2.82, and 2.71. The unit is nanometer. The correlation value of these two sequences becomes a large value of 0.85.

From the result, the image analysis device 814 determines that the space 3 is the initial core, displays "Initial core: Space 3" in a right upper area of the image 901, and further displays "Correlation value 0.85" (Step S708). Further, in a case where a position of the initial core is specified using the correlation value, the correlation values of all the candidates are obtained and the position of the initial core may be specified using a candidate having a maximum value. However, since there is a case where the correlation value is greatly different as described above (herein, −0.10 and 0.85), a threshold value is set for the correlation value instead of obtaining the correlation values of all the candidates, and the position of the initial core may be specified using a candidate when the candidate having a correlation value exceeding the threshold value is specified.

The operator can be seen that the lines 1, 4, and 5 are lines interposing the gap and the lines 2 and 3 are lines interposing the initial core from the result. When each line width is measured, an average width of the line interposing the gap becomes 19.51 nm, and an average width of the line interposing the initial core becomes 16.38 nm. The designed dimensions of all lines are 18 nm. From the above, it can be seen that the dimensions are different between a pattern of the area where the resist pattern is formed from the beginning and a pattern of the area where the resist pattern is not formed from the beginning. As a result of inspection, the resist pattern is slightly left because it takes short time in the process of removing the resist pattern after FIG. 1(d), and thus it can be known that the pattern does not become the state of FIG. 1(e) but the film is left at a position where the resist is originally formed as illustrated in FIG. 12. The component of a film to be secondly formed on the film has a nature of hardly being deposited. As a result, the line interposing the initial core becomes thin.

Further, since it can be seen that the initial core is the space 3, a program of automatically calculating various types of indexes can also be executed. In this case, a window appears to display a result in the monitor screen. FIG. 13 shows a schematic diagram of the window. Further, this is a calculation example from one image, and data from a plurality of images may be collected in a table having a format illustrated FIG. 13 in cooperation with a recipe for measurement, and output to a medium designated as a text file or the storage device 813 for storage.

Through this embodiment, the problem becomes clear, and the resist removing process is improved. Therefore, the performance of the final products becomes even, and the yield is improved.

Hitherto, according to this embodiment, it is possible to provide a scanning electron microscope and an inspection device which can specify a position of the initial core with a high accuracy even when the fine line and space patterns are formed using the SADP in plural times. In addition, with the use of various types of indexes of dimensions such as the space of the initial core, it is possible to make a problem estimation of a process and to make an improvement in the process from a final pattern image which is created using the SADP process in plural times.

Second Embodiment

A second embodiment of the invention will be described in the following. Further, the configurations which are described in the first embodiment but not in this embodiment can also be applied to this embodiment if not otherwise specified. In this embodiment, the description will be made about an example in which an overlay error is calculated in a mass-production factory of semiconductor elements to prevent the yield from being lowered.

Figure 14:
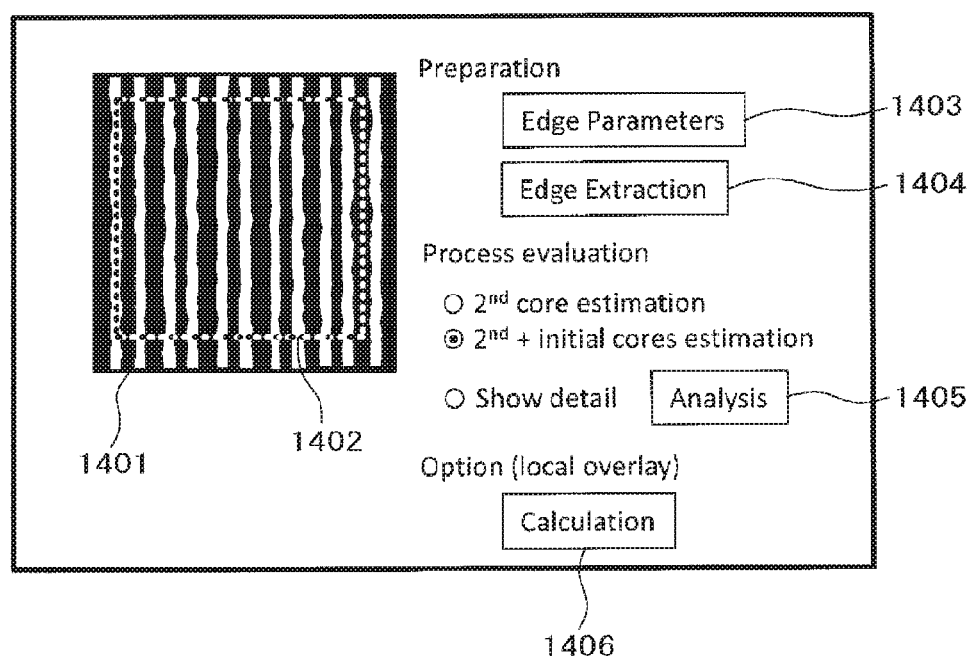
FIG. 14 is a diagram schematically illustrating a window displayed in an operation terminal screen in a second embodiment of the invention.
Figures 15, 16:
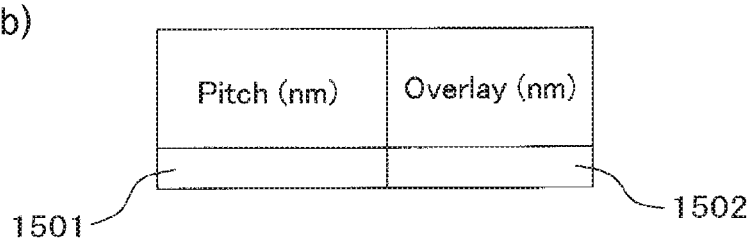
FIG. 15 is an exemplary table displayed in the operation terminal screen in the second embodiment of the invention.
FIG. 16 is an exemplary table of analysis results displayed in the operation terminal screen in the second embodiment of the invention.

The scanning electron microscope used in this embodiment is the same as that of the first embodiment, and configured as illustrated in FIG. 8. In addition, FIG. 14 is a diagram schematically illustrating a window which appears when the invention is implemented in the monitor screen in the middle of image analysis. FIGS. 15 and 16 are examples in which the results obtained in the invention and analysis results are displayed in the operation terminal screen.

An observation pattern is manufactured by the process of FIG. 1 in which the cross-section is illustrated. The pattern which has a rectangular cross-section and formed in the uppermost surface in FIG. 1(a) is manufactured by immersion ArF lithography. The overlay error in the x direction of the resist pattern with respect to the lower layer (not illustrated in FIG. 1) when the immersion ArF lithography is performed is 2.10 nm in a positive direction of the x coordinates. In addition, an absolute value of the overlay error between the layer and the lower layer is necessarily equal to or less than 4 nm in order to keep the performance of the device equal to or more than a certain value.

First, the operator operates the terminal 812 of the sample observation device and the analysis system, carries the sample (semiconductor wafer) 807 into the device, irradiates the electron beam 803, and acquires an image of the pattern through the control system 811. In addition, an image analysis program is executed to display a window of the program on the monitor. This situation is illustrated in FIG. 14. An image 1401 acquired in the window is displayed, and the operator sets an area on the image for the analysis. The set area is displayed with a frame 1402 of the broken line.

Next, the operator clicks a button 1403 of "Edge Parameters" displayed in the screen. Then, a parameter setting window for defining the edge of the line pattern appears, and the operator inputs a definition of the edge. Next, a button 1404 of "Edge Extraction" is clicked. Then, the line patterns in the frame (analysis area) 1402 of the broken line of the image 1401 are numbered from the left side. In addition, the edge is displayed as a set of points on the image.

Next, the operator selects to obtain only the second core in the core specification algorithm or also to obtain the initial core after obtaining the second core. Herein, it is assumed that the selection is made to obtain the initial core after obtaining the second core.

Thereafter, the operator clicks a display button 1405 of "Analysis", and executes a specific analysis of the initial core specification. Then, "Initial core: Space 4" and "Correlation value 0.66" appear in a right upper area of the image 1401.

Thereafter, when a button 1406 of "Calculation" is clicked, the center position of the first resist pattern is estimated. When the center position is set to the origin of an x axis, the coordinates of the center position of each pattern are calculated, and displayed in the screen as a table as illustrated in FIG. 15(a). In addition, the window illustrated in FIG. 15(b) appears. Herein, there are categories A to D of lines. The lines B and C mean the lines interposing the initial core. The lines A and D mean the lines farthest from the initial core. A designed pitch value of the line pattern is input to a cell 1501 of FIG. 15(b), and an overlay deviation amount of 2.10 nm with respect to the lower layer in the lithography for forming the first resist pattern is input to a cell 1502. Then, the overlay deviation amount of each pattern is automatically calculated, and a table of calculation results displayed in the operation terminal screen is created as illustrated in FIG. 16, for example.

The operator registers a recipe with the operations until a time when the results of FIG. 16 are obtained after the image is acquired, and sets the same analysis to be automatically performed on the image of 100 places. While one image includes 8 to 9 lines, the calculation function of the terminal 812 classifies all these lines into A to D, and calculates the overlay deviation amount of each line. As a result, it is determined that 212 lines corresponding to about a quarter of total 868 lines are deviated exceeding the overlay deviation amount of 4 nm. Such an amount is a level causing an increase in product defect rate and a problem.

Therefore, the operator temporally has stopped the mass-production process to prevent the yield reduction from being worse any more, and checked the process and found that there is a large deviation in CDS_2ndcore. Therefore, the device performing the first film formation is checked, and it is found that a voltage is unstable. The yield can be returned to a target level by fixing the problem.

According to the invention, it is possible to detect an increase of the overlay deviation amount which could not been found so far, and suppress the yield reduction. In addition, it is possible to take an action for improvement, and to secure the yield of the final products.

According to this embodiment above, the same effects as those of the first embodiment can be obtained. In addition, it is possible to improve the evaluation on the overlay deviation of each pattern and an improvement of the process from the final pattern image created by the SAQP process.

Third Embodiment

A third embodiment of the invention will be described below. This embodiment shows an example in which the invention is applied to inspection on a fine line pattern group formed by performing the SADP three times in the mass-production process of the semiconductor elements to specify the initial core position. Further, the configurations which are described in the first or second embodiment but not in this embodiment can also be applied to this embodiment if not otherwise specified.

Figure 17:
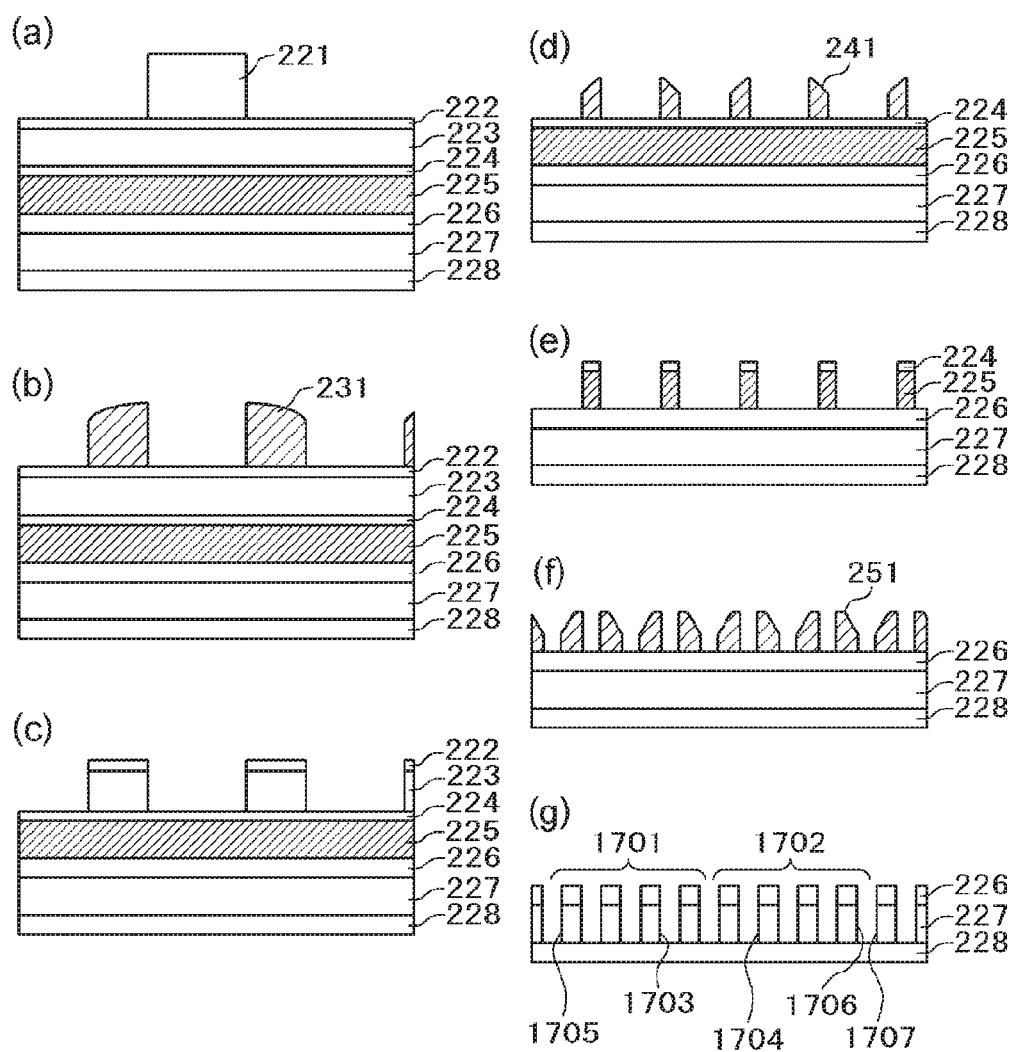
FIG. 17 is a diagram schematically illustrating a cross section of a pattern in a fine pattern processing process to which the invention is applied according to a third embodiment of the invention.
Figure 18:
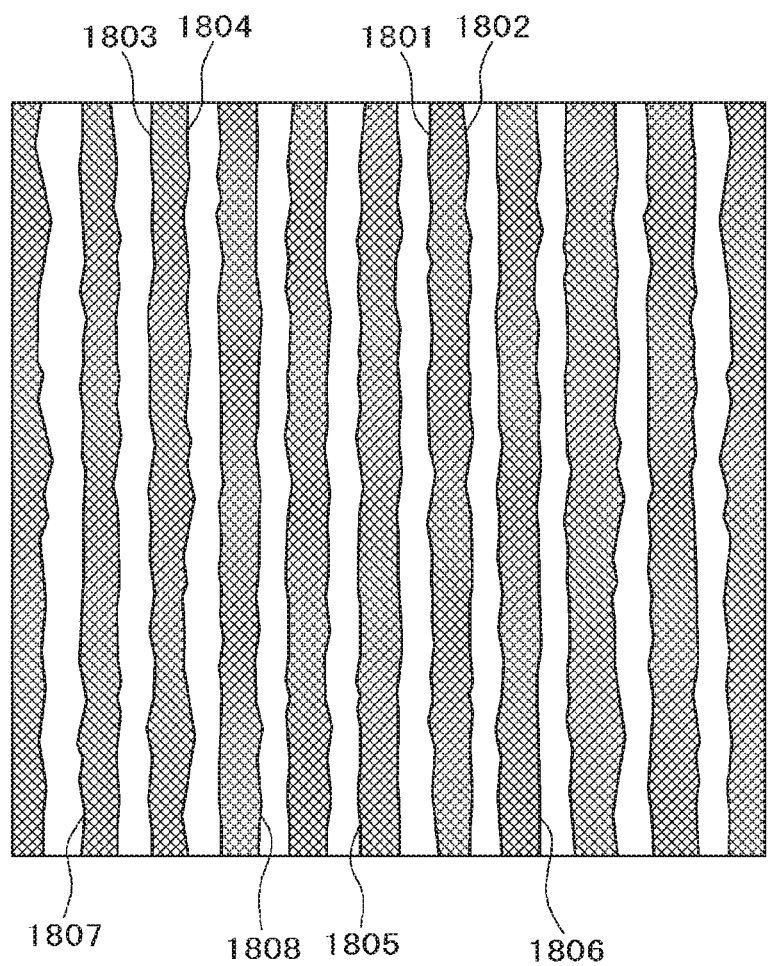
FIG. 18 is a diagram schematically illustrating an observation image obtained in the third embodiment of the invention.

FIG. 17 is a diagram schematically illustrating an outline of a pattern forming process observed in this embodiment. FIG. 18 illustrates an observation image obtained in this embodiment. FIG. 19 is a diagram illustrating an example in which a resultant table obtained in this embodiment is displayed in the operation terminal screen.

A schematic diagram of the pattern forming process is illustrated in FIG. 17. Through performing the SADP three times, it is obtained a dense pattern which has a ⅛ pitch compared to that of the initially formed pattern.

FIG. 17 is a cross-sectional view schematically illustrating the pattern for describing a process of forming fine lines and spaces by performing the SADP three times. FIGS. 17(a) to 17(c) illustrate a process of forming the line pattern by a first SADP, FIGS. 17(d) to 17(e) illustrate a process of forming the line pattern by a second SADP, and FIGS. 17(f) to 17(g) illustrate a process of forming the line pattern by a third SADP. First, a resist layer 221 patterned in a line shape is formed on a stacked film of a silicon oxide film 228, a carbon film 227, a silicon oxide film 226, a silicon nitride film 225, a silicon oxide film 224, a carbon film 223, and an antireflection film 222, all of which are stacked in an order from the lower side (FIG. 17(a)). Further, while the resist layer 121 is illustrated by one in the drawing, a number of resist layers are formed in practice. Next, a silicon oxide film 231 is formed to cover the resist layer 221, and the silicon oxide film 231 of a line shape is formed on both sides of the resist layer 221 by perform an anisotropic etching on the silicon oxide film 131, and the resist layer 221 is eliminated by ashing (FIG. 1(b)). Next, the stacked film of the antireflection film 222 and the carbon film 223 is anisotropically etched using the silicon oxide film 231 of a line shape so as to form a stacked film of a line shape (FIG. 1(c)). Therefore, it is possible to form a dense pattern of which the pitch corresponds to the half pitch of the pattern created by the first lithography in the beginning.

Next, the antireflection film 222 is eliminated, and a silicon oxide film 241 is formed by covering the carbon film 223 of a line shape. Thereafter, the silicon oxide film 241 is subjected to an anisotropic dry etching to cause the silicon oxide film 241 of a line shape to be formed in the same size as that of the carbon film 223. Then, the carbon film 223 is eliminated (FIG. 17(*d*)). Next, the anisotropic etching is performed using the silicon oxide film 241 as a mask to form a stacked film of the silicon oxide film 224 and the silicon nitride film 225 of a line shape (FIG. 17(*e*)). Therefore, it is possible to divide the pitch further more with respect to the pattern formed by the SADP.

Subsequently, the silicon oxide film 224 is eliminated, and a silicon oxide film 251 is formed by covering the silicon nitride film 225 of a line shape. Therefore, the silicon oxide film 251 is anisotropically dry-etched to form the silicon oxide film 251 of a line shape on both sides of the silicon nitride film 225. Then, the silicon nitride film 225 is eliminated (FIG. 17(*f*)). Next, the anisotropic etching is performed using the silicon oxide film 251 as a mask to form a stacked film of the silicon oxide film 226 and the carbon film 227 of a line shape (FIG. 17(*g*)). Therefore, it is possible to divide the pitch further more with respect to the pattern formed by the SAQP. Further, the above materials are given as an example, and not limited to the materials.

FIG. 18 illustrates a schematic diagram of an image obtained by observing the fine line and space patterns manufactured through the process illustrated in FIG. 17. Portions drawn with an inclined lattice pattern are the spaces, and white portions are the line patterns.

On the basis of the rule illustrated in FIG. 5, the shapes of the edges belonging to a line group 1701 are all similar to each other in FIG. 17, and the shapes of the edges belonging to a line group 1702 are also similar to each other. Therefore, a candidate position of the initial core and a candidate position of the gap are determined by inspecting a distribution of the similarity of the adjacent edges. Herein, the initial core is between the line group 1701 and the line group 1702, but in this stage the left side of the line group 1701 or the right side (which is the gap) of the line group 1702 in the drawing is not able to be discriminated.

It can be seen that a portion between the twelfth edge 1801 and the thirteenth edge 1802 from the left side in the image and similarly a portion between the fourth edge 1803 and the fifth edge 1804 from the right side become the candidates of the initial core when the rule is applied to FIG. 18.

In addition, on the basis of the rule illustrated in FIG. 5, the outside edge of the space rightly outside the initial core in FIG. 17 (that is, an edge 1703 and an edge 1704) comes to have the largest LER. In addition, the edges adjacent to the gap (that is, edges 1705, 1706, and 1707) come to have the smallest LER. Therefore, assuming that the initial core is between the edge 1801 and the edge 1802, the LER values of the left edge (located at the tenth position from the left side) 1805 of the left space with respect to the line containing the edge 1801 which is expected to have a large LER, the right edge (located at the fifteenth position from the left) 1806 of the right space with respect to the line containing the edge 1802, and the edges 1803 and 1804 which are assumed to have a small LER are calculated. On the contrary, even in a case where the initial core is between the fourth and fifth edges (corresponding to the edges 1803 and 1804 respectively) from the left side, the LER of the second and seventh edges (corresponding to the edges 1807 and 1808 respectively) which are expected to have a large LER, or the LER values of the edges 1801 and 1802 which are expected to have a small LER may be compared. Then, these values are calculated.

FIG. 19 is a diagram illustrating an example in which the result is displayed in the operation terminal screen. Considering the first case, it can be seen that the LER values of the edges 1805 and 1806 are large, and the LER values of the edges 1803 and 1804 are relatively small. Considering an inversed case, the LER values of the edges 1807 and 1808 and the LER values of the edges 1801 and 1802 are compared. However, these values are almost the same, and there is no difference found. Therefore, it is estimated that the former is correct. It is determined that the initial core is between the edge 1801 are 1802.

Accordingly, the overlay deviation of the lower layer of each pattern can be calculated similarly to the second embodiment, and the process of the overlay deviation can be accurately managed.

Further, the invention is not limited to the above embodiments, and includes various modifications. For example, the above embodiments are merely given to describe the invention in detail to help understanding, and there is no need to provide all the configurations described above. In addition, some of the configurations of a certain embodiment may be replaced with the configurations of the other embodiments, and the configurations of the other embodiments may be added to the configurations of the subject embodiment. In addition, some of the configurations of each embodiment may be omitted, replaced with other configurations, and added to other configurations.

Hitherto, the present invention has been described, and embodiments of the invention are given in the following.

(1) A pattern inspection method of performing a film deposition on a first pattern formed on a substrate and downwardly observing a sample having a plurality of line patterns formed by a process of forming a second pattern in both side walls of the first pattern one or more times, including:

calculating an index of roughness of each line edge (that is, a line edge roughness value) from a plurality of line groups which are adjacent in parallel; and specifying a position of a line or a space where a center of the first pattern is located from a distribution in an image of the line edge roughness value.

(2) A pattern inspection method of performing a film deposition on a first pattern formed on a substrate and downwardly observing a sample having a plurality of line patterns formed by a process of forming a second pattern in both side wall of the first pattern one or more times, including:

calculating a similarity in roughness shape of adjacent edges interposing a space to specify a position of the line pattern formed before final film deposition;

calculating an index of roughness of each line edge (that is, a line edge roughness value) from a plurality of line groups which are adjacent in parallel; and specifying a position of a line or a space where a center of the first pattern is located from a distribution in an image of the line edge roughness value.

(3) A pattern inspection method of performing a film deposition on a first pattern formed on a substrate and downwardly observing a sample having a plurality of line patterns formed by a process of forming a second pattern in both side wall of the first pattern one or more times, including:

calculating a variation along a longitudinal direction of a line at a center position of the line with respect to a plurality of lines which are adjacent in parallel and setting the variation as a variation of a center of the line;

calculating a similarity in shape of a center variation of the adjacent lines to specify a position of the line pattern formed before a final film is deposited;

calculating an index of roughness of each line edge (that is, a line edge roughness value) from a plurality of line groups which are adjacent in parallel; and specifying a position of a line or a space where a center of the first pattern is located from a distribution in an image of the line edge roughness value.

(4) The pattern inspection method according to any one of (1) to (3), wherein only the line edge roughness values of an edge formed at a position of an edge of the first pattern and an edge formed at a position farthest from the first pattern.

(5) The pattern inspection method according to any one of (1) to (4), wherein a distance between two edges at positions which are predetermined on the basis of the center position of the first pattern specified in an image is calculated.

(6) A pattern inspection device which performs a film deposition on a first pattern formed on a substrate and downwardly observes a sample having a plurality of line patterns formed by a process of forming a second pattern in both side walls of the first pattern one or more times, including:

a calculation device which extracts an edge of a pattern from an image;

at least one of a calculation device which calculates a similarity in shape of two adjacent edges interposing a space and a calculation device which calculates a similarity in variation in a direction along a line at a center position of two adjacent lines interposing a space;

an analysis device which analyzes a distribution of line edge roughness values; and a device which stores the image and data of an edge position.

REFERENCE SIGNS LIST 1 initial core
2 second core
3 gap
101 left edge of line pattern
102 right edge of line pattern
103 left edge of line pattern
104 right edge of line pattern
105 left edge of line pattern
106 right edge of line pattern
107 left edge of line pattern
108 right edge of line pattern
121 resist layer
122 antireflection film
123 carbon film
124 silicon oxide film
125 silicon nitride film
126 silicon oxide film
131 silicon oxide film
141 silicon oxide film
221 resist layer
222 antireflection film
223 carbon film
224 silicon oxide film
225 silicon nitride film
226 silicon oxide film
227 carbon film
228 silicon oxide film
231 silicon oxide film
241 silicon oxide film
251 silicon oxide film
401 left edge of line pattern
402 right edge of line pattern
403 left edge of line pattern
404 line pattern of right edge
405 left edge of line pattern
406 line pattern of right edge
407 left edge of line pattern
408 line pattern of right edge
409 left edge of line pattern
410 line pattern of right edge
411 space portion
412 line portion
413 space portion
414 line portion
415 space portion
416 line portion
417 space portion
418 line portion
419 space portion
420 line portion
421 space portion
501 line edge corresponding to surface of deposited film
502 line edge of core pattern
601 CDL_finalcore
602 CDL_finalgap
603 CDS_initcore
604 CDS_2ndcore
605 CDS_gap
606 CD_core
607 CD_gap
S701 process of operating program for specifying initial core
S702 process of calling target data
S703 process of setting analysis target area
S704 process of inputting definition of edge
S705 process of extracting edge
S706 process of selecting algorithm and option
S707 process of specifying second core
S708 process of specifying initial core
801 housing
802 electron gun
803 electron beam
804 lens
805 deflector
806 lens
807 sample
808 sample stage
809 secondary electron generated from sample
810 detector
811 control system
812 terminal of sample observation device and analysis system
813 data storage device
814 image analysis device
815 input/output unit
816 determination unit
817 display unit
901 image display area in window
902 analysis area displayed on image
903 button for starting to input edge definition
904 button for executing edge extraction
905 button for executing analysis
1401 image display area in window 1402 analysis area displayed on image
1403 button for starting to input edge definition
1404 button for executing edge extraction
1405 button for executing analysis
1406 button for executing overlay deviation calculation
1501 input cell for executing overlay deviation calculation
1502 input cell for executing overlay deviation calculation
1701 line group having similar roughness shape
1702 line group having similar roughness shape
1703 right edge of line
1704 left edge of line
1705 left edge of line
1706 right edge of line
1707 left edge of line
1801 twelfth edge from left in image
1802 thirteenth edge from left in image
1803 fourth edge from left in image
1804 fifth edge from left in image
1805 tenth edge from left in image
1806 fifteenth edge from left in image
1807 second edge from left in image
1808 seventh edge from left in image

The invention claimed is:

1. A charged particle beam device, comprising:
a charged particle source;
a sample stage that is used to place a sample having a pattern of a plurality of lines, the lines being formed by performing a process two or more times in which a first pattern of a line shape formed on a stacked film is covered and a second pattern of a line shape is formed on both side walls of the first pattern by film deposition;
an irradiation optical system that emits charged particles discharged from the charged particle source as a charged particle beam toward the sample placed on the sample stage;
a detector that detects secondary charged particles discharged from the sample by emission of the charged particle beam;
a display unit that displays image data of a surface of the sample that is obtained on the basis of a signal of the secondary charged particles detected by the detector;
a calculation unit that calculates a line edge roughness value on the basis of the image data, the line edge roughness value being an index of roughness of a line edge of the pattern of the plurality of lines that are adjacent in parallel in the sample; and
a determination unit that compares the line edge roughness values in the pattern of the plurality of lines, and determines a position of an initial core that is a center of the first pattern.

2. The charged particle beam device according to claim 1, wherein the sample is formed with two second patterns with respect to the first pattern, and includes total four patterns of a line shape in which two of patterns are formed for each second pattern, and
wherein, when magnitudes of the line edge roughness values in the four lines are compared, and in a case where the magnitudes are sequentially small, intermediate, large, intermediate, intermediate, large, intermediate, and small, the determination unit determines that the initial core is at a position interposed by the line edges of which the line edge roughness values are intermediate, intermediate.

3. The charged particle beam device according to claim 1, wherein, in a case where the pattern of a line shape is formed by a positive process, the determination unit determines that the initial core is positioned in a space portion.

4. The charged particle beam device according to claim 1, wherein, in a case where the pattern of a line shape is formed by a negative process, the determination unit determines that the initial core is positioned in a line portion.

5. The charged particle beam device according to claim 1, further comprising:
an edge calculation unit that calculates a distance between two edges at predetermined positions on the basis of a position of the initial core.

6. The charged particle beam device according to claim 1, wherein the display unit displays a width of the first pattern, or a value obtained by adding a width of the initial core and a width of lines or spaces disposed on both sides of the initial core.

7. A charged particle beam device, comprising:
a charged particle source;
a sample stage that is used to place a sample having a pattern of a plurality of lines, the lines being formed by performing a process two or more times in which a first pattern of a line shape formed on a stacked film is covered and a second pattern of a line shape is formed on both side walls of the first pattern by film deposition;
an irradiation optical system that emits charged particles discharged from the charged particle source as a charged particle beam toward the sample placed on the sample stage;
a detector that detects secondary charged particles discharged from the sample by emission of the charged particle beam;
a display unit that displays image data of a surface of the sample that is obtained on the basis of a signal of the secondary charged particles detected by the detector;
a calculation unit that calculates a similarity in shape of right and left edges of a plurality of spaces that are adjacent in parallel in the sample on the basis of the image data; and
a determination unit that determines a position of a second core that is the second pattern formed on both sides of the first pattern on the basis of a similarity in shape of right and left edges in the pattern of a line or the space.

8. The charged particle beam device according to claim 7, wherein the determination unit determines a position of an initial core that is a center of the first pattern on the basis of a position of the second core.

9. The charged particle beam device according to claim 8, further comprising:
a calculation unit that calculates a line edge roughness value on the basis of the image data, the line edge roughness value being an index of roughness of a line edge of the pattern of the plurality of patterns of a line shape that are adjacent in parallel in the sample,
wherein the determination unit compares the line edge roughness values in the pattern of the plurality of patterns of a line shape, obtains a correlation value between a comparison result and the line edge roughness value measured in the pattern of the plurality of patterns of a line shape, and determines a position of the initial core.

10. The charged particle beam device according to claim 9, wherein the display unit displays the position of the initial core and the correlation value.

11. A charged particle beam device, comprising:
a charged particle source;
a sample stage that is used to place a sample having a pattern of a plurality of patterns of a line shape, the patterns of line shape being formed by performing a process two or more times in which a first pattern of a line shape formed on a stacked film is covered and a second pattern of a line shape is formed on both side walls of the first pattern by film deposition;
an irradiation optical system that emits charged particles discharged from the charged particle source as a charged particle beam toward the sample placed on the sample stage;
a detector that detects secondary charged particles discharged from the sample by emission of the charged particle beam;
a display unit that displays image data of a surface of the sample that is obtained on the basis of a signal of the secondary charged particles detected by the detector;
a similarity calculation unit that calculates a similarity in roughness shape of the adjacent edges interposing a space of the plurality of the patterns of line shape or a variation along a longitudinal direction of a line at a center position of the line with respect to the plurality of the patterns of line shape that are adjacent in parallel, and calculate a similarity in shape of a center variation of the adjacent lines as a center variation of the line;
a position determination unit that determines a position of a pattern of a line shape formed before final film deposition on the basis of the similarity of roughness shape of the edge or the similarity in shape of the center variation;
a roughness calculation unit that calculates a line edge roughness value, the line edge roughness value being an index of roughness of the line edge of the plurality of the patterns of line shape that are adjacent in parallel; and
an initial core determination unit that determines a position of an initial core that is a center of the first pattern on the basis of a position of the pattern of a line shape formed before the final film deposition and the line edge roughness value.

12. An inspection device, comprising:
a display unit that displays image data of a surface of a sample obtained by emitting a charged particle beam onto the sample having a plurality of patterns of line shape, the patterns of line shape being formed by performing a process two or more times in which a first pattern of a line shape formed on a stacked film is covered and a second pattern of a line shape is formed on both side walls of the first pattern by film deposition;
a calculation unit that calculates a line edge roughness value on the basis of the image data, the line edge roughness value being an index of roughness of a line edge of the plurality of patterns of line shape that are adjacent in parallel in the sample; and
a determination unit that compares the line edge roughness values in the pattern of the plurality of patterns of line shape, and determines a position of an initial core that is a center of the first pattern.

13. The inspection device according to claim 12, wherein a width of the pattern of a line shape or a width of a space of the pattern of a line shape is calculated.

14. An inspection device, comprising:
a display unit that displays image data of a surface of a sample obtained by emitting a charged particle beam onto the sample having a plurality of patterns of line shape, the patterns of line shape being formed by performing a process two or more times in which a first pattern of a line shape formed on a stacked film is covered and a second pattern of a line shape is formed on both side walls of the first pattern by film deposition;
a calculation unit that calculates a similarity in shape of right and left edges of a plurality of spaces that are adjacent in parallel in the sample on the basis of the image data; and
a determination unit that determines a position of a second core that is the second pattern formed on both sides of the first pattern on the basis of a similarity in shape of right and left edges in the pattern of a line shape or the space.

15. An inspection device, comprising:
a display unit that displays image data of a surface of a sample obtained by emitting a charged particle beam onto the sample having a plurality of patterns of line shape, the patterns of line shape being formed by performing a process two or more times in which a first pattern of a line shape formed on a stacked film is covered and a second pattern of a line shape is formed on both side walls of the first pattern by film deposition;
a similarity calculation unit that calculates a similarity in roughness shape of the adjacent edges interposing a space of the plurality of patterns of line shape or a variation along a longitudinal direction of a line at a center position of the line with respect to the plurality of patterns of line shape that are adjacent in parallel, and calculate a similarity in shape of a center variation of the adjacent lines as a center variation of the line;
a position determination unit that determines a position of a pattern of a line shape formed before final film deposition on the basis of the similarity of roughness shape of the edge or the similarity in shape of the center variation;
a roughness calculation unit that calculates a line edge roughness value, the line edge roughness value being an index of roughness of the line edge of the plurality of the patterns of line shape that are adjacent in parallel; and
an initial core determination unit that determines a position of an initial core that is a center of the first pattern on the basis of a position of the pattern of a line shape formed before the final film deposition and the line edge roughness value.

* * * * *